United States Patent [19]

Hung et al.

[11] Patent Number: 5,754,469
[45] Date of Patent: May 19, 1998

[54] PAGE MODE FLOATING GATE MEMORY DEVICE STORING MULTIPLE BITS PER CELL

[75] Inventors: Chun-Hsiung Hung, Hsinchu, Taiwan; Ray-Lin Wan, Fremont, Calif.; Yao-Wu Cheng, Taipei, Taiwan

[73] Assignee: Macronix International Co., Ltd., Hsinchu, Taiwan

[21] Appl. No.: 718,335

[22] PCT Filed: Jun. 14, 1996

[86] PCT No.: PCT/US96/10374

§ 371 Date: Oct. 1, 1996

§ 102(e) Date: Oct. 1, 1996

[87] PCT Pub. No.: WO97/48098

PCT Pub. Date: Dec. 18, 1997

[51] Int. Cl.$^6$ .................................................. G11C 11/34
[52] U.S. Cl. ........................... 365/185.03; 365/185.12; 365/185.22
[58] Field of Search ................. 365/185.03, 185.12, 365/185.13, 185.18, 185.22, 185.24

[56] References Cited

U.S. PATENT DOCUMENTS

| | | | |
|---|---|---|---|
| 4,054,864 | 10/1977 | Audaire et al. | 365/185.03 |
| 4,811,294 | 3/1989 | Kobayashi et al. | 365/185.22 |
| 4,890,259 | 12/1989 | Simko | 365/45 |

(List continued on next page.)

FOREIGN PATENT DOCUMENTS

| | | |
|---|---|---|
| 95/00077 | 1/1995 | WIPO. |
| WO 95/34074 | 12/1995 | WIPO. |
| WO 95/34075 | 12/1995 | WIPO. |

OTHER PUBLICATIONS

Mills, D. et al., "A 3.3V 50MHz Synchronous 16Mb Flash Memory", Digest of Technical Papers, 1995 IEEE International Solid-State Circuits Conference, Session 7, Feb. 16, 1995, pp. 119–131.

Tanaka, et al. "High-Speed Programming and Program-Verify Methods Suitable For Low-Voltage Flash Memories", Symposium on VLSI Circuits, Digest of Technical Papers, 1994, pp. 64–62.

Suh, et al. "A 3.3V 32Mb Nand Flash Memory With Incremental Step Pulse Programming Scheme". 1995 IEEE International Solid-State Circuits Conference, pp. 128–129, Feb. 16, 1995.

(List continued on next page.)

Primary Examiner—Joseph A. Popek
Attorney, Agent, or Firm—Wilson Sonsini Goodrich & Rosati

[57] ABSTRACT

An array (10) of multi-level floating gate memory cells includes wordlines (18) connected to memory cells along a row in the array, and bit lines (12) connected to memory cells along a column in the array. A wordline voltage source (27) is included which supplies selectively wordline voltages corresponding to respective threshold voltages of the memory cells in the array. A plurality of bit latches form a page buffer (11). Bit latches are coupled to corresponding bit lines, and have a first state and a second state. The bit latches include circuits (213–216) to change the bit latches from the first state to the second state in response to signals on the corresponding bit lines that are generated in response to a wordline voltage on a selected wordline being greater than or equal to the threshold voltage of a memory cell on the corresponding bit line connected to the selected wordline. Logic (21) controls the wordline voltage source and the bit latches to apply in a sequence the wordline voltages, and to sense the state of the bit latches after applying each wordline voltage in the sequence to determine the threshold voltages of the memory cells.

40 Claims, 8 Drawing Sheets

U.S. PATENT DOCUMENTS

| | | | |
|---|---|---|---|
| 5,163,021 | 11/1992 | Mehrotra et al. | 365/185.03 |
| 5,218,569 | 6/1993 | Banks | 365/189.01 |
| 5,245,570 | 9/1993 | Fazio et al. | 365/185.13 |
| 5,283,758 | 2/1994 | Nakayama et al. | 365/185.13 |
| 5,294,819 | 3/1994 | Simko | 257/314 |
| 5,297,081 | 3/1994 | Challa | 365/184 |
| 5,323,351 | 6/1994 | Challa | 365/218 |
| 5,357,463 | 10/1994 | Kinney | 365/185.22 |
| 5,363,330 | 11/1994 | Kobayashi et al. | 365/185.11 |
| 5,369,609 | 11/1994 | Wang et al. | 365/185.02 |
| 5,379,256 | 1/1995 | Tanaka et al. | 365/185.17 |
| 5,414,658 | 5/1995 | Challa | 365/185.06 |
| 5,418,743 | 5/1995 | Tomioka et al. | 365/189.01 |
| 5,422,845 | 6/1995 | Ong | 365/185.18 |
| 5,450,363 | 9/1995 | Christopherson et al. | 365/205 |
| 5,615,149 | 3/1997 | Kobayashi et al. | 365/185.12 |
| 5,625,590 | 4/1997 | Choi et al. | 365/185.17 |
| 5,638,326 | 6/1997 | Hollmer et al. | 365/185.2 |
| 5,646,886 | 7/1997 | Brahmbhatt | 365/185.16 |

OTHER PUBLICATIONS

M. Bauer, et al. "A Multilevel–Cell 32Mb Flash Memory", *1995 IEEE International Solid–State Circuits Conference*, pp. 132–133, Feb. 16, 1995.

T. Jung, et al. "A 3.3V 128Mb Multi–Level Nand Flash Memory For Mass Storage Applications", *1996 IEEE International Solid–State Circuits Conference*, pp. 32–33, Feb. 8, 1996.

PAGE MODE FLOATING GATE MEMORY DEVICE STORING MULTIPLE BITS PER CELL

BACKGROUND OF THE INVENTION

1. Field of the Invention

The present invention relates to integrated circuit memory devices based on floating gate transistor technology; and more particularly to high speed page mode flash memory in which multiple bits of data are stored in each cell.

2. Description of Related Art

Flash memory is a growing class of non-volatile storage integrated circuit based on floating gate transistors. The memory cells in a flash device are formed using so called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate of the transistor by a second layer of insulating material. To store multiple bits in a single floating gate transistor, it is known to charge or discharge the floating gate to a plurality of predefined levels. The plurality of predefined levels establish different threshold voltages for the floating gate transistor, so the level to which the transistor is programmed may be readily sensed. See, U.S. Pat. No. 4,054,864 entitled METHOD AND DEVICE FOR THE STORAGE OF ANALOG SIGNALS by Audaire, et al., issued 18 Oct. 1977; U.S. Pat. No. 4,890,259 entitled HIGH DENSITY INTEGRATED CIRCUIT ANALOG SIGNAL RECORDING AND PLAYBACK SYSTEM by Simko, issued 26 Dec. 1989; U.S. Pat. No. 5,163,021 entitled MULTI-STATE EEPROM READ AND WRITE CIRCUITS AND TECHNIQUES by Mehrotra, et al., issued 10 Nov. 1992; U.S. Pat. No. 5,218,569 entitled ELECTRICALLY ALTERABLE NON-VOLATILE MEMORY WITH N-BITS PER MEMORY CELL by Banks, issued 8 Jun. 1993; U.S. Pat. No. 5,294,819 entitled SINGLE-TRANSISTOR CELL EEPROM ARRAY FOR ANALOG OR DIGITAL STORAGE by Simko, issued 15 Mar. 1994; U.S. Pat. No. 5,418,743 entitled METHOD OF WRITING INTO NON-VOLATILE SEMICONDUCTOR MEMORY by Tomioka, et al., issued 23 May 1995; U.S. Pat. No. 5,422,845 entitled METHOD AND DEVICE FOR IMPROVED PROGRAMMING THRESHOLD VOLTAGE DISTRIBUTION IN ELECTRICALLY PROGRAMMABLE READ ONLY MEMORY ARRAY by Ong, issued 6 Jun. 1995; U.S. Pat. No. 5,450,363 entitled GRAY CODING FOR A MULTILEVEL CELL MEMORY SYSTEM by Christopherson, et al., issued 12 Sep. 1995; International Publication Number WO 95/34074 entitled DYNAMIC SINGLE TO MULTIPLE BIT PER CELL MEMORY by Intel Corporation, published 14 Dec. 1995; International Publication Number WO 95/34075 entitled SENSING SCHEMES FOR FLASH MEMORY WITH MULTILEVEL CELLS by Intel Corporation, published 14 Dec. 1995; Bauer, et al., "A Multilevel-Cell 32 Mb Flash Memory", 1995 IEEE international Solid-State Circuits Conference, pg. 132–133 (Feb. 16, 1995); and Jung, et al., "A 3.3V 128 Mb Multi-Level NAND Flash Memory for Mass Storage Applications", 1996 IEEE International Solid-State Circuits Conference, pg. 32–33 (Feb. 8, 1996).

The prior art multi-level floating gate memory systems typically provide for byte-by-byte programming algorithms, and require sense amplifiers capable of detecting multiple levels of conduction in the floating gate memory devices being sensed. Thus, the multi-level flash or floating gate memory devices of the prior art are limited in speed by the byte-by-byte programming and sensing algorithms, and require complex sense amplifier circuitry.

To store data in a floating gate memory cell, the floating gate is charged or discharged using a Fowler-Nordheim tunneling mechanism, or a hot electron injection mechanism. The Fowler-Nordheim tunneling mechanism is executed by establishing a large positive (or negative) voltage between the gate and source or drain of the device. This causes electrons to be injected into (or out of) the floating gate through the thin insulator. The hot electron injection mechanism is based on an avalanche process. Hot electron injection is induced by applying potentials to induce high energy electrons in the channel of the cell, which are injected across the thin insulator into the floating gate. To induce hot electron injection, a potential is applied across the source and drain of the device, along with a positive potential on the control gate. The positive potential on the control gate tends to draw electrons from the current in the channel of the device into the floating gate.

The acts of charging and discharging the floating gate in a floating gate memory device are relatively slow compared to writing other memory types, like static or dynamic random access memory, and limit the speed with which data may be written into the device.

Another problem associated with floating gate memory devices arises because the charging and discharging of the floating gate is difficult to control over a large array of cells. Thus, some of the cells program or erase more quickly than others in the same device. In a given program or erase operation, not all the cells subject of the operation will settle with the same amount of charge stored in the floating gate. Thus, so called program verify and erase verify sequences have been developed to efficiently ensure that the memory is being accurately programmed and erased. The program and erase verify operations are based on comparing the data stored in the floating gate memory array with the intended data. The process of comparing data is relatively time consuming, involving sequencing byte by byte through the programmed or erased cells. If a failure is detected in the verify sequence, then the program or erase operation is retried. Program retries are typically executed word-by-word or byte-by-byte in prior art devices. Thus, bits successfully programmed in a byte with one failed bit are subject to the program cycle repeatedly. This can result in over-programming and failure of the cell. Also, when multiple bits per cell are stored, the program and verify operations must be applied several times to establish the multiple threshold levels involved.

One approach to resolving this issue is set forth in U.S. Pat. No. 5,163,021 by Mehrotra, et al., at column 19, line 10 at sec. FIGS. 14–17.

To improve the efficiency of program and program verify operations, so called page mode flash devices have been developed. In these devices, a page buffer is associated with the memory array. The page buffer includes a set of bit latches, one bit latch associated with each global bit line in the array. To program a page in the array, the page buffer is loaded with the data to be programmed, by transferring byte by byte the program data into the bit latches of the page buffer. The program operation is then executed in parallel on a bit line by bit line basis controlled by the contents of the bit latches. The verify procedure is based on clearing automatically all of the bit latches in the page buffer which are successfully programmed in a parallel operation. The page buffer is then read byte-by-byte to confirm that all bits have been cleared, indicating a successful program operation.

The page mode program process is described for example in commonly owned prior PCT Patent application entitled ADVANCED PROGRAM VERIFY FOR PAGE MODE FLASH MEMORY, filed 5 Jan. 1995, application no. PCT/US95/00077. In this application, the program verify operation relies on the sense amplifiers in the memory, which are limited in number, typically to 16, to sense the state of the memory cells being programmed. If the cell is programmed to the proper state, then the bit latch is reset based on the sense amplifier output. The sense amplifier is used because of charge sharing issues which arise from attempting to sense the level of bit lines in the memory array by a latch structure. The bit latch structure typically requires a significant current to reliably reset the latch. The sense amplifier circuit is able to provide sufficient current to reset the bit latch, while the bit line current through the memory cells is normally low due to the small geometry of the cells.

Other attempts at page mode program verify circuits have been made. For example, Tanaka, et al., "High-Speed Programming And Program-Verify Methods Suitable For Low-Voltage Flash Memories", Symposium on VLSI Circuits, Digest of Technical Papers, 1994, pgs. 64–62. The Tanaka, et al., paper describes a system in which the bit latches are directly coupled to the bit lines of the array. However, in the design proposed by Tanaka, et al., the bit latches directly fight the bit line voltage. Thus the bit line is required to conduct sufficient current to flip the bit latch, or alternatively the time allowed for the discharging of the bit line must be enlarged during the verify sequence. The design is therefore difficult to implement efficiently, and the data integrity is questionable because the bit line and latch fight for charge during the verify sequence.

Another prior art approach is described in Suh, et al., "A 3.3V 32 Mb NAND Flash Memory With Incremental Step Pulse Programming Scheme", 1995 IEEE International Solid-State Circuits Conference, pg. 128-129 (Feb. 16, 1995). In Suh, et al., a page buffer structure is described in which a current mirror structure is utilized to boost the driving capability of the bit lines for resetting bit latches. In Suh, et al., during the verify operation, the wordlines are pumped to an increased voltage to double the cell current. A current mirror is coupled with each bit line to fight with the cell. After waiting enough time for the bit line to discharge, a parallel reset of the latches is based on resulting the bit line voltage. The reliance on a current mirror in association with each bit latch requires extra current drive capability during the verify process, and increases the complexity of the circuit.

Neither Suh, et al., nor Tanaka, et al., describe bit latches be for use with processes which involve applying a high voltage to the bit lines, as required for some types of floating gate memory program or erase operations.

An improved page buffer which operates with low current bit latches, and is capable of supporting program, program verify, read and erase verify processes in a page mode is desirable. Also, it is desirable that the page buffer be useful for applying high voltage pulses to bit lines based on the contents of the page buffer. Finally, extension of these techniques to multiple bit per cell memory devices will allow high speed, page mode floating gate memory devices with greater data storage densities, and lower costs.

SUMMARY OF THE INVENTION

The present invention provides a floating gate memory array capable of storing multiple bits per cell, and which operates in a page mode. Therefore, a greater storage density is achieved, and speed is improved by taking advantage of the page buffering techniques discussed below.

Accordingly, the present invention can be characterized as an integrated circuit that comprises an array of multiple bit, floating gate memory cells. A plurality of wordlines are connected to respective sets of memory cells along a row in the array, and a plurality of bit lines are connected to respective sets of memory cells along a column in the array. A wordline voltage source is included which supplies selectively a plurality of wordline voltages. The wordline voltages in the plurality correspond to respective threshold voltages of the memory cells in the array. Decoder logic connects the wordline voltage source to a selected wordline in the plurality of wordlines in response to addresses. A plurality of bit latches form a page buffer. Bit latches in the plurality of bit latches are coupled to corresponding bit lines, and have a first state and a second state. The bit latches include circuits to change the bit latches from the first state to the second state in response to signals on the corresponding bit lines that are generated in response to a wordline voltage on a selected wordline being greater than or equal to (alternatively less than or equal to) the threshold voltage of a memory cell on the corresponding bit line and connected to the selected wordline. Logic controls the wordline voltage source and the plurality of bit latches to apply in a sequence the plurality of wordline voltages to the selected wordline, and to sense the state of the plurality of bit latches after applying each wordline voltage in the sequence to determine the threshold voltages of the set of memory cells connected to the selected wordline. Thus, a page mode read operation is executed for a multi-bit per cell floating gate memory device.

According to another aspect of the invention, a buffer memory is coupled to the plurality of bit lines, and the logic that senses the states of the bit latches includes circuitry for transferring the data indicating the states of the bit latches to the buffer memory. This circuitry includes accumulation logic that accumulates the state of each bit latch over the sequence, and stores the result in the buffer memory. Thus, for a multi-level cell having four threshold levels, a buffer memory having two bits per cell is provided.

According to another aspect of the invention, the integrated circuit includes program logic to control the wordline voltage source in the plurality of bit latches to program a set of memory cells connected to a selected wordline. The control logic executes a plurality of program cycles including the following:

a first threshold cycle to set bit latches in the plurality of bit latches to a "program" state for memory cells coupled to the corresponding bit lines to be programmed to a first threshold voltage and to a "do not program" state for memory cells coupled to the corresponding bit lines to be left in an erased state, to execute a program cycle including applying a program potential to bit lines coupled to bit latches loaded with the "program state", applying a first wordline voltage to the selected wordline, wherein the first wordline voltage corresponds to the first threshold voltage, and setting the state of the plurality of bit latches to the "do not program" state after applying the first wordline voltage to indicate whether the first threshold voltage has been successfully programmed, and logic to retry the program cycle until all bit latches in the plurality of bit latches are set to the "do not program" state or until an error condition is encountered;

a second threshold cycle to set bit latches in the plurality of bit latches to the "program" state for memory cells coupled to the corresponding bit lines to be programmed to a second threshold voltage and to a "do not program" state for memory cells coupled to the corresponding bit lines to be left in an erased state or left programmed to the first threshold voltage, to execute a program cycle including applying a program potential to bit lines coupled to bit latches loaded with the "program" state, applying a second wordline voltage to the selected wordline, wherein the second wordline voltage corresponds to the second threshold voltage, and setting the state of the plurality of bit latches to the "do not program" state after applying the second wordline voltage to indicate whether the second threshold voltage has been successfully programmed, and logic to retry the program cycle until all bit latches in the plurality of bit latches are set to the "do not program" state or until an error condition is encountered; and a third threshold cycle to set bit latches in the plurality of bit latches to the "program" state for memory cells coupled to the corresponding bit lines to be programmed to a third threshold voltage and to a "do not program" state for memory cells coupled to the corresponding bit lines to be left in an erased state, left programmed to the first threshold voltage, or left programmed to the second threshold voltage, to execute a program cycle including applying a program potential to bit lines coupled to bit latches loaded with the "program" state, applying a third wordline voltage to the selected wordline, wherein the third wordline voltage corresponds to the third threshold voltage, and setting the state of the plurality of bit latches to the "do not program" state after applying the third wordline voltage to indicate whether the third threshold voltage has been successfully programmed, and logic to retry the program cycle until all bit latches in the plurality of bit latches are set to the "do not program" state or until an error condition is encountered.

Furthermore, according to yet another unique aspect of the present invention, the logic that senses the states of the plurality of bit latches after applying each wordline voltage in the sequence includes circuits that (1) apply a first voltage to the plurality of bit lines, (2) isolate the bit lines such that bit lines coupled to memory cells having a threshold voltage lower than the wordline voltage being applied are driven toward a second voltage through the memory cells, and (3) set the bit latches in the plurality of bit latches to the second state if the voltage on the corresponding bit line is driven to about the second voltage. This circuitry is based on low current bit latch structures which sense the state of the isolated bit lines without drawing current from the bit lines.

The present invention can also be characterized as a method for determining a state of a set of multiple bit per cell memory cells in a floating gate memory. The method comprises the steps of:

setting bit latches in a set of bit latches coupled to memory cells to be programmed to a first threshold voltage, to a "program" state, and other bit latches in the set of bit latches to a "do not program" state;

executing a first level program and program verify cycle including the four steps of
1) applying a programming potential to bit lines in the set of bit lines in response to a "program" state in corresponding bit latches in the set of bit latches;
2) setting the set of bit lines across which memory cells in the set of memory cells are accessible to an initial voltage level;
3) applying a first wordline voltage to a wordline across which memory cells in the set of memory cells are accessible, the first wordline voltage corresponding to the first threshold voltage;
4) responding to changes in respective voltage levels of bit lines in the set of bit lines in parallel to set bit latches in the set of bit latches on which the respective voltage levels pass a determinate threshold during the step of applying the first wordline voltage to the "do not program" state;

retrying the first level program and program verify cycle if any bit latches remain in the "program" state until a retry threshold is reached, or until all bit latches in the set of bit latches have been set to the "do not program" state;

setting bit latches in the set of bit latches coupled to memory cells to be programmed to a second threshold voltage to the "program" state, and other bit latches in the set of bit latches to the "do not program" state;

executing a second level program and program verify cycle including the four steps of
1) applying a programming potential to bit lines in the set of bit lines in response to a "program" state in corresponding bit latches in the set of bit latches;
2) setting the set of bit lines across which memory cells in the set of memory cells are accessible to an initial voltage level;
3) applying a second wordline voltage to a wordline across which memory cells in the set of memory cells are accessible, the second wordline voltage corresponding to the second threshold voltage;
4) responding to changes in respective voltage levels of bit lines in the set of bit lines in parallel to set bit latches in the set of bit latches on which the respective voltage levels pass a determinate threshold during the step of applying the second wordline voltage to the "do not program" state; and retrying the second level program and program verify cycle if any bit latches remain in the "program" state until a retry threshold is reached, or until all bit latches in the set of bit latches have been set to the "do not program" state.

The program and program verify cycles are repeated for each level which may be programmed into the floating gate memory cell, except for the erased state. For example, in a four level memory, the floating gate memory cells have an erased state, for example a high threshold state, and three programmed states, corresponding to progressively lower turn on thresholds. The program and program verify cycles are executed for each of the three programmed states. This results in storing of four bits per cell in a multi-level floating gate memory array.

According to yet another aspect of the present invention, the multi-level programming and reading techniques are applied to a floating gate memory array which is organized in a NOR array. According to this aspect of the invention, a floating gate memory array is provided which includes at least X rows and Y columns of floating gate memory cells. The floating gate memory cells have respective control gates, source terminals and drain terminals, in a column of floating gate memory cells is divided into a plurality of column segments. X wordlines are coupled to the floating gate memory cells in one of the X rows of floating gate memory cells. A plurality of local bit lines are coupled to the drain terminals of the floating gate memory cells in respective column segments, and a plurality of local source lines are coupled to the source terminals of the floating gate memory cells in respective column segments and to a source of a source potential. A plurality of global bit lines overlay the array. Data in and out circuitry is coupled to the plurality of global bit lines to provide for reading and writing data in the memory array. Coupled to the array is selector circuitry which provides for selective connection of local bit lines to corresponding global bit lines, so that access to the Y columns of floating gate memory cells by the data in and out circuitry is provided across the global bit lines. Logic is included to program the cells in the array by setting threshold voltages of the memory cells selectively to one of more than two levels, such as four, eight or sixteen levels. Reading and programming circuitry, such as discussed above is included in the array designed according to this aspect.

According to one preferred aspect of the invention, the floating gate memory array is implemented in a so-called drain-source-drain structure which provides for efficient layout, and reliable high speed operation.

By implementing the multi-level page mode structure with a NOR array, such as described above, the techniques taught by the present invention may be applied more efficiently than is possible using an alternative array design, such as the NAND array design.

Accordingly, the present invention provides an efficient high speed page mode architecture for a multiple bit per cell floating gate memory array, such as a flash memory. The design takes advantage of the high speed page mode processing techniques, along with the high density multiple bit per cell storage technology available using floating gate memory. Furthermore, the multiple levels are sensed using controllable wordline voltages, and a single sense amplifier design. This greatly simplifies over prior art multi-level systems, which require multi-level sensing, in response to a single wordline voltage. Furthermore, the present invention extends the page mode multi-level design to a NOR floating gate memory array architecture. The NOR architecture provides a high density layout, and many benefits associated with avoiding disturbance of neighboring cells during the program, read, and erase operations in the device.

Other aspects and advantages of the present invention can be seen upon review of the figures, the detailed description, and the claims which follow.

DETAILED DESCRIPTION

A detailed description of preferred embodiments of the present invention is provided with reference with FIGS. 1–8, in which FIGS. 1–4 illustrate the structure utilized according to the present invention, and FIGS. 5–8 illustrate processes executed which take advantage of the low current bit latches and multiple bit per cell operation provided by the present invention.

Figure 1:
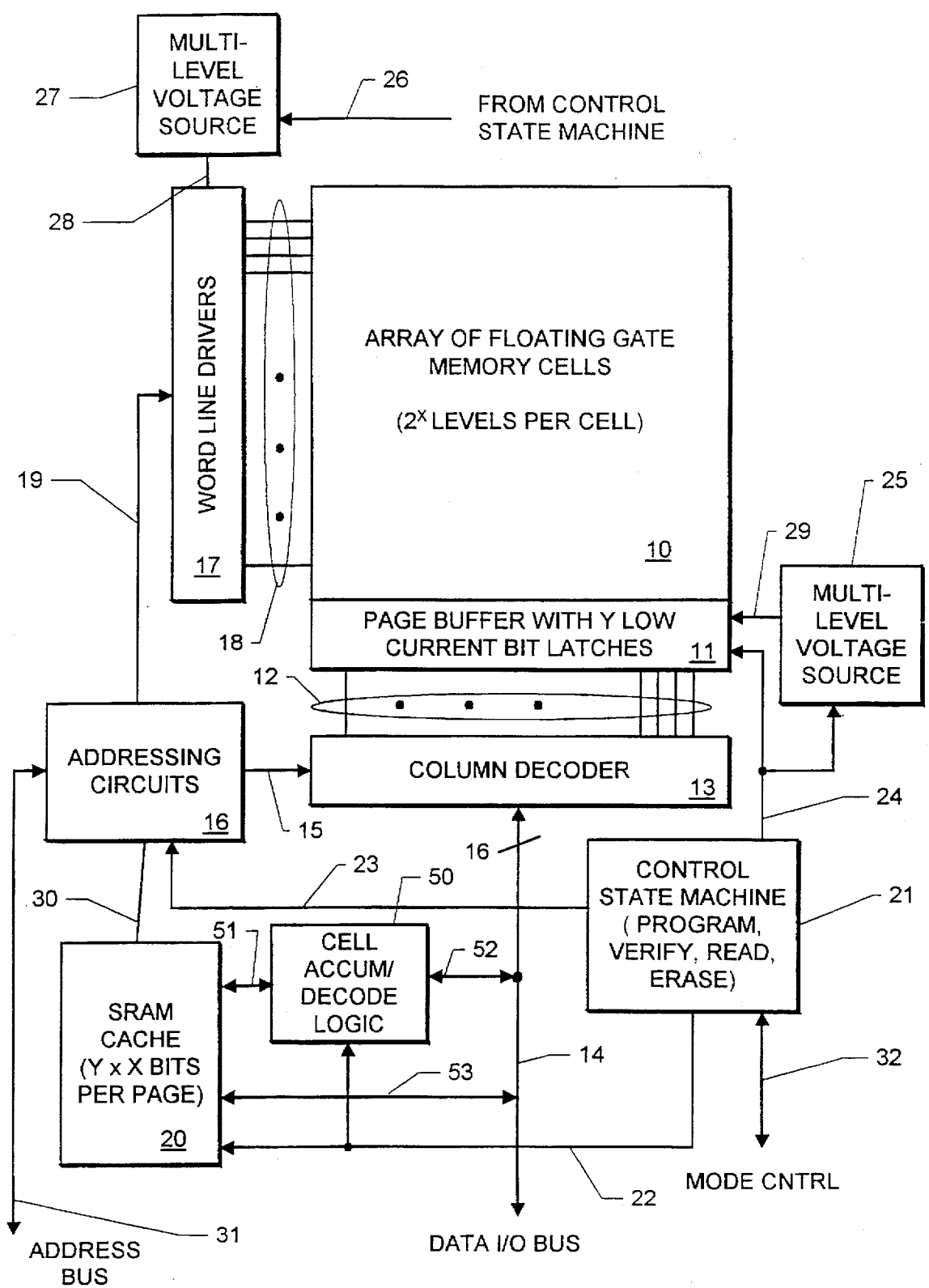
FIG. 1 is a basic block diagram of a multiple bit per cell, floating gate memory integrated circuit according to the present invention.

FIG. 1 is a block diagram of an integrated circuit memory including an array 10 of floating gate memory cells storing $2^X$ levels per cell, where X is a number of bits needed to identify a particular level. A page buffer 11 with low current bit latches according to the present invention is coupled to the array 10 of floating gate memory cells. The low current bit latches in the page buffer 11, including Y bit latches, where Y is an integer, are coupled to respective bit lines in the set 12 of bit lines which pass through the array 10 of floating gate memory cells. The set 12 of bit lines is coupled to a column decoder 13 for selecting subsets of the set of bit lines onto a data input/output bus 14. In one example, the data input/output bus 14 is 16 bits wide (2 bytes) and the set 12 of bit lines is 1K (1024) bits (127 bytes) wide. Thus, the column decoder 13 will select 16 bit lines in the set 12 of bit lines onto the data input/output bus 14 at a time in response to addressing signals supplied across line 15 from addressing circuits 16 on the device. Also coupled to the array 10 of floating gate memory cells is a set of wordline drivers 17 which drive a set 18 of wordlines in the array 10 of floating gate memory cells. The wordline drivers include decoding circuitry to select particular rows of cells response to addressing signals supplied on line 19 from the addressing circuits 16 of the device.

Also, an SRAM cache 20, also called a buffer, is included on the integrated circuit memory. The SRAM cache 20 is connected across line 53 to the data input/output bus 14, and acts as a cache (also called a buffer) for storing and reading data for the array 10 of floating gate memory cells. Thus, data is transferred into the cache 20, and from the cache 20 into the array 10 of floating gate memory cells, and vice versa in order to provide a flexible input/output interface for the integrated circuit memory. The cache 20 stores X bits per cell in a page. Thus, for a page Y bits wide, the cache 20 stores Y×X bits per page. In one embodiment, the memory cells are programmable to four levels, and X equals two.

The integrated circuit memory also includes a control state machine 21 (firmware, of software, or both) which supplies control signals on line 22 to the SRAM cache 20, control signals on line 23 to the addressing circuits 16, control signals on line 24 to the page buffer 11 and to a multi-level voltage source 25 connected to the page buffers across line 29. Also, control signals are supplied from the control state machine on line 26 to a multi-level voltage source 27 which is coupled to the wordline drivers 17 across line 28.

According to the present invention, as described in detail below, the memory cells in the array 10 are programmed and program verified one level at a time, and likewise they are read one level at a time. Thus, coupled to the SRAM cache 20 according to the present invention is cell accumulate and decode logic 50. The cell accumulate and decode logic 50 is coupled to the SRAM cache 20 across line 51, and to the data I/O bus 14 across line 52. The cell accumulate and decode logic 50 is controlled by the control state machine 21 across line 22 as indicated in the figure. During a program operation, the two (or more) bits of a given cell are received from the SRAM cache 50 across line 51 by the cell accumulate and decode logic 50, and depending on the data value indicated by the two or more bits, one bit is supplied on line 52 to the data I/O bus 14 for loading in the page buffer 11 for a given program cycle. Conversely, during a read operation, as each level of the floating gate memory cells in array is sensed using the page buffer 11, one bit per cell is received across line 52. After the sensing sequence has been completed for the multiple levels per cell, the values received are accumulated by the cell accumulate and decode logic 50, and supplied as a two or more bit value to the SRAM cache across line 51. Although a variety of approaches may be taken, the functioning of the cell accumulate and decode logic 50 can be understood better with reference to the description of operation of specific examples provided below.

The SRAM cache 20 is responsive to addressing signals on line 30 from the addressing circuits 16, and control signals on line 22 from the control state machine 21 to act cooperatively with the input/output operations for the array 10 of floating gate memory cells.

Addresses are supplied to the integrated circuit memory on address bus 31. The address bus 31 is coupled to the addressing circuits 16. The addressing circuits generate addressing signals for the wordline drivers 17, the column decoder 13, and the SRAM cache 20.

Also, mode control inputs are supplied on line 32 to the control state machine 21. The mode control inputs on line 32 may be supplied from an external source to the integrated circuit memory, or may be generated by decoding address and data lines, as is known in the art.

According to the present invention, the control state machine 21 executes processes for multi-level page mode program and program verify, multi-level page mode read, and page mode erase verify operations, in a manner which takes advantage of the low current bit latches in the page buffer 11. These processes can be understood better after a description of a preferred floating gate memory array and page buffer architecture as provided below with reference FIGS. 2-4.

Figure 2:
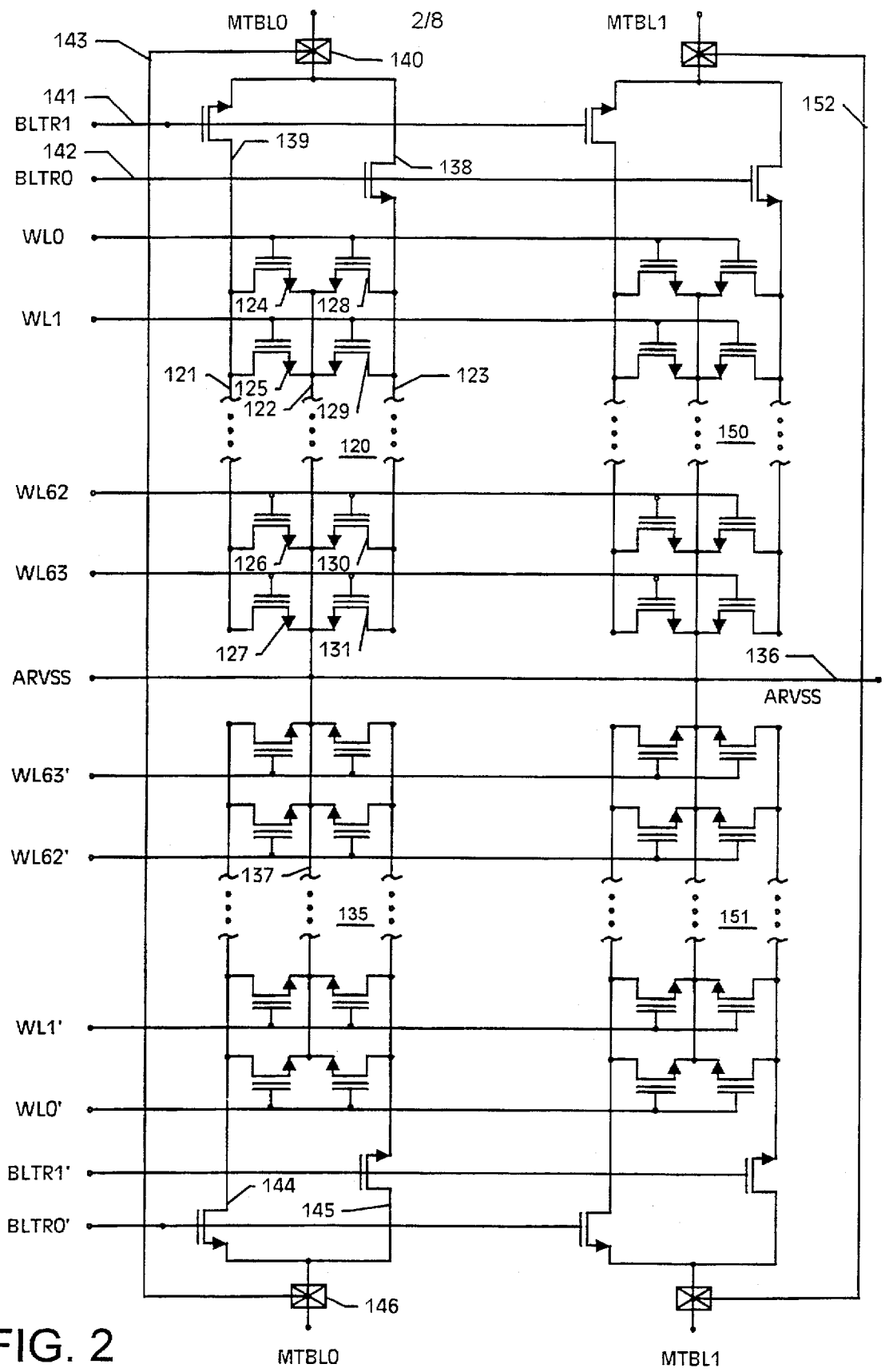
FIG. 2 is a diagram of a floating gate memory array architecture, suitable for use with the present invention.

FIG. 2 illustrates a preferred architecture of the floating gate memory array 10, which in this embodiment is a NOR style flash EEPROM array in which two columns of flash EEPROM cells share a single metal bit line. FIG. 2 shows four pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Wordlines WL0 through WL63 each overlay the floating gates of a cell in a first one of the pairs of columns and a cell in the second one of the pairs of columns. The first pair 120 of columns includes one column including cell 124, cell 125, cell 126, and cell 127. Not shown are cells coupled to wordlines WL2 through WL61. The second column of the first pair 120 of columns includes cell 128, cell 129, cell 130, and cell 131. Along the same column of the array, a second pair 135 of columns is shown. It has a similar architecture to the pair 120 of columns except that it is laid out in a mirror image. Also, the second pair 135 of columns is connected to the same metal bit line MTBL0 as the first pair 120.

Thus, a cell in the first one of the pair of columns, such as the cell 125, includes a drain in drain diffusion line 121, and a source in the source diffusion line 122. A floating gate overlays the channel region between the first drain diffusion line 121 and the source diffusion line 122. The wordline WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a drain in the drain diffusion line 121, a source coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

The architecture shown in FIG. 2 is based upon a drain-source-drain unit forming two columns of cells which are isolated from adjacent drain-source-drain units to prevent leakage current from adjacent columns of cells. The architecture can be extended to units of more than two columns, with appropriate tolerances for leakage current in the sensing circuitry, or other controls on current leakage from unselected cells. Thus, for instance, fourth and fifth diffusion lines could be added within a given isolated region to create a drain-source-drain-source-drain structure which provides four columns of cells.

Column pairs are laid out horizontally and vertically to provide an array of flash EEPROM cells comprising M wordlines and 2N columns. The array requires only N metal bit lines each of which is coupled to a pair of columns of flash EEPROM cells through select circuitry, as described above.

Although the figure only shows four column pairs 120, 135, 150, and 151, coupled to two metal bit lines 143 and 152 (MTBL0–MTBL1), the array is repeated horizontally and vertically as required to establish a large scale flash EEPROM memory array. Thus, column pairs 120 and 150 which share a wordline are repeated horizontally to provide a segment of the array. Segments are repeated vertically. A group of segments (e.g., eight segments) having respective wordlines coupled to a shared wordline driver may be considered a sector of the array.

In a preferred system, 1024 metal bit lines are shared by 2048 columns of cells. The 1024 metal bit lines are connected to respective bit latches in the page buffer. The bit latches store a control bit for each metal bit line, used for verify program, verify, read and erase verify operations as discussed in more detail below.

The present invention may be applied in many aspects to other memory array architectures, such as NAND style arrays, or other architectures, for example those architectures taught in the above cited prior art references.

Figure 3:
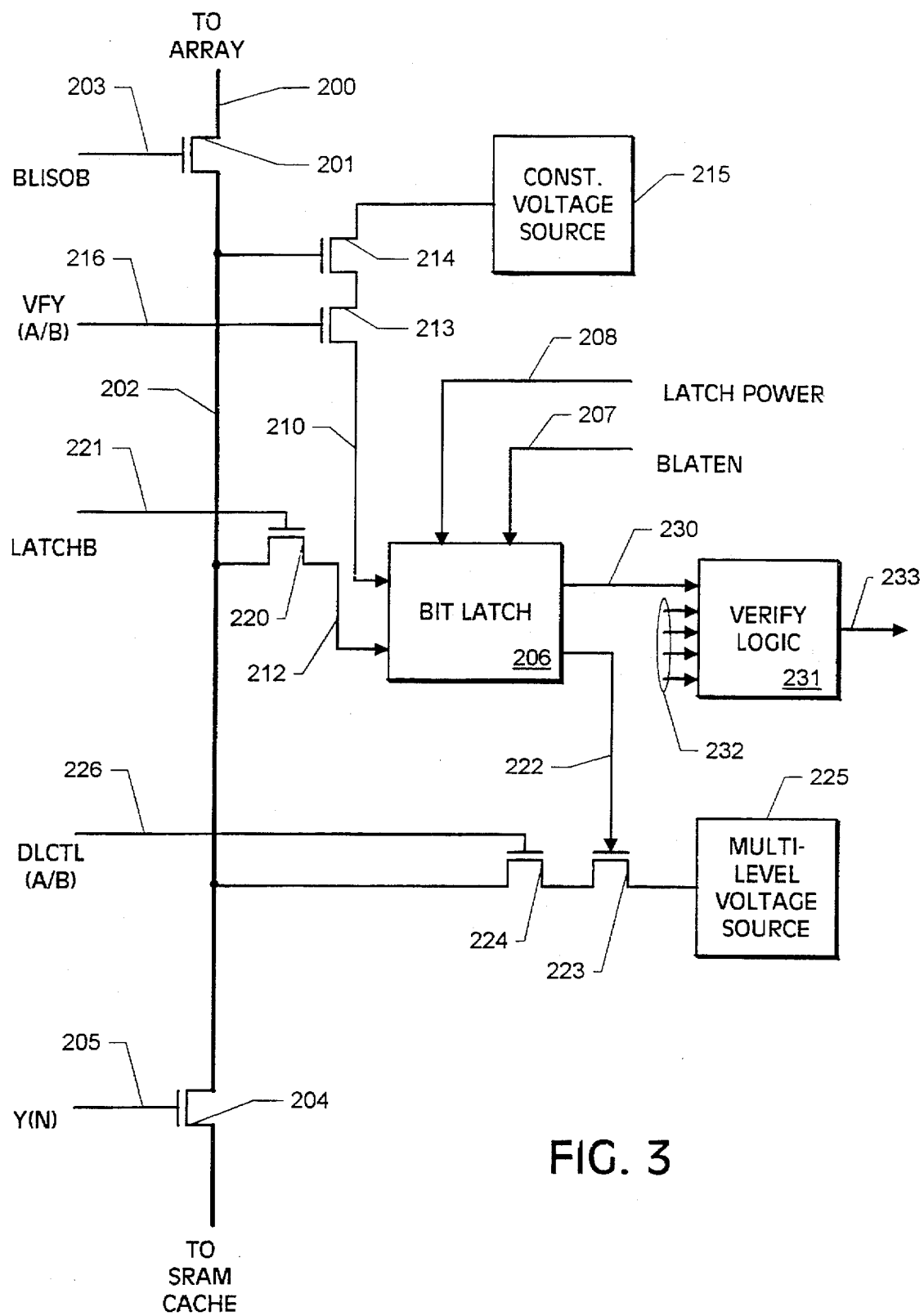
FIG. 3 is a simplified diagram of the bit latch structure according to the present invention.

FIG. 3 illustrates the basic structure of a bit line control element, including bit latch 206 in the page buffer 11 for an integrated circuit memory such as that described in FIG. 1. Thus, FIG. 3 includes a bit line 200 which corresponds for example to a metal bit line MTBL0 in the architecture of FIG. 2. The bit line 200 is connected to a pass transistor 201 which is used for the purpose of isolating a bit line segment 202 within the page buffer from the metal bit line 200 of the array. Pass transistor 201 is controlled by a control signal BLISOB on line 203. The bit line segment 202 within the page buffer is coupled to column select circuits represented by pass gate 204. The column select pass gate 204 is controlled by a column select signal Y(N) on line 205, where N goes from 0 to 63 in a set of 1K bit lines using a 16 bit input/output bus.

The page buffer consists of a sequence of bit line control elements, associated with respective bit lines. Each bit line control element includes a bit latch 206 coupled with the bit line segment 202. The bit latch 206 in a preferred system is implemented with an SRAM type memory element composed of opposing inverters as known in the art. The bit latch 206 has an enable input supplied on line 207 which receives the signal BLATEN. The power used by the bit latch 206 is supplied on line 208. As illustrated in the figure, a signal LATCH POWER is supplied on line 208 which sets the power level of the bit latch 206. Typically this power level will correspond to the VDD voltage in the device. However it is controlled during various operations as discussed below.

The bit latch 206 has two data inputs. The first data input is received on line 210, and the second data input is received on line 212. The first data input on line 210 is coupled to a pass gate structure including a first pass transistor 213 and a second pass transistor 214 connected in series. On the opposite end of pass transistor 214, a constant voltage source 215 is connected. The gate of pass transistor 214 is coupled to the bit line segment 202. The gate of the pass transistor 213 is coupled to a verify control signal VFY (A,B) on line 216. In one embodiment, there are two (or more) verify control signals (A and B) for strobing separate sets of bit latches. In this embodiment, every other bit line receives VFY(A) and the remaining bit lines receive VFY(B).

The second input on line 212 to the bit latch 206 is supplied through pass transistor 220 from the bit line segment 202 which is separated from the main bit line 200 by the pass transistor 201. The gate of pass transistor 220 is connected to line 221 which receives the control signal LATCHB.

Bit latch 206 has output 222. The output 222 is connected as a control input to a pass gate composed of pass transistor 223 and pass transistor 224 connected in series between a multi-level voltage source 225, and the bit line segment 202. The output on line 222 of the bit latch 206 is connected to the gate of pass transistor 223. The gate of pass transistor 224 is connected on line 226 to a data line control signal DLCTL (A,B). In one embodiment, there are two (or more) data line control signals (A and B) separately sensing sets of bit latches in a read mode in coordination with the two VFY (A,B) signals.

The bit latch 206, is configured so that it has a very low impact on the bit line 200, in the terms of current consumption, and so that the current requirements of the bit latch do not fight against the current requirements of the bit line 200 during page mode operations. With a low current bit latch according to the present invention, a wide variety of efficient page mode processes are implemented.

Thus, the first input 210 provides a circuit by which the bit latch 206 is loaded with a constant value in response to a change in the voltage level on the bit line segment 202 to a determinate level low enough to turn on the pass transistor 214. Thus for example if the constant voltage source is VDD, the pass transistor 214 is implemented as a p-channel device. If the voltage level on the bit line segment 202 is low, when the control signal VFY on line 216 is strobed, then the constant will be loaded from the constant voltage source 215 into the bit latch 206, without consuming current on the bit line 200.

The verify or page read operation therefore operates by setting or "pre-charging" the bit line to an initial voltage level and isolating the pre-charged bit line so that the only discharge path is through the memory cell on a selected wordline. If the wordline voltage on the selected wordline is above the threshold level of the memory cell, then the bit line is discharged within a specified amount of time. The control signed VFY is strobed at the end of the specified amount of time to sense the result. Therefore, the threshold level of the memory cell in the context of the embodiment of FIG. 3, is the wordline voltage level at which the cell will conduct sufficient current to discharge the bit line to a level at or past the threshold of pass transistor 214, within the specified time.

If the constant voltage source 215 is ground, then the pass transistor 214 is implemented with an n-channel device, along with other modifications, and reacts to a high voltage level on the bit line 200 to cause the constant to be loaded into the bit latch 206.

The input 212 to the bit latch 206 is connected to a second circuit which is controlled by the control signal LATCH B on line 221 to load a data value supplied on the bit line segment 202. This path is utilized primarily for loading data through the column select transistor 204 into the bit latch 206, which can be driven by relatively high current data source. This input however is disabled during sensing of the voltage level on the bit line 200.

The output on line 222 of the bit latch is connected to a third circuit which is utilized to transfer a selected voltage level from the multi-level voltage source 225 onto the bit line segment 202 in response to the control bit stored in the bit latch 206 and the enable signal DLCTL on line 226. When the pass gate 201 is enabled, the voltage level supplied by the multi-level voltage source 225 is passed onto the main bit line 200. The enable signal DLCTL on line 226 is used for the purpose of controlling the duration of the connection of the multi-level voltage source 225 to the bit line. The multi-level voltage source can be set to a high programming potential, and the application of the programming potential to the bit line is controlled by the contents of the bit latch 206. Also, the multi-level voltage source 225 can be set to VDD, to ground, or to another read potential, and the application of the VDD voltage level to the bit line segment 202 controlled by the contents of the bit latch.

According to another aspect of the invention, the bit latch 206 has a second output on line 230, which is connected to logic 231 to determine whether all the bit latches 206 in the page buffer store the constant value (for program verify) or to determine whether any bit latch 206 in the page buffer stores the constant value (for erase verify). The logic 231 includes one input coupled to each bit latch 206 in the page buffer, as represented by the lines 232. If all of the bit latches 206 store a low constant, then the output of the logic function will be high on line 233 indicating that all bit latches have been reset to the low constant value. If any one of the bit latches has not been reset to the constant value, then the output of the logic function on line 233 will be low, indicating that not all have been reset to the constant value. This logic is useful in program or erase verify situations as described below.

Figure 4:
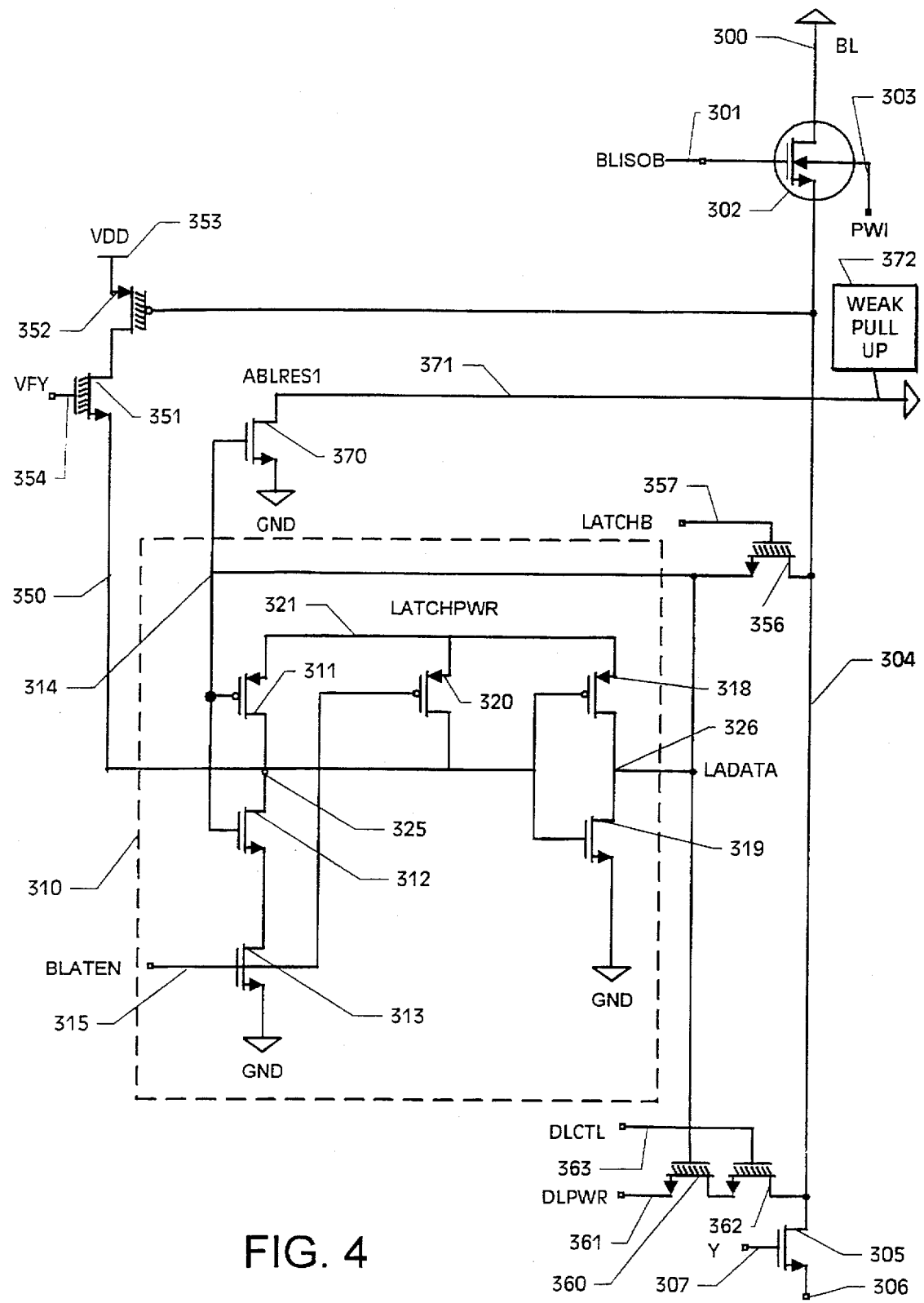
FIG. 4 is a circuit diagram of a preferred embodiment of the bit latch structure according to the present invention.

FIG. 4 provides a detailed circuit diagram of a bit line control element including the bit latch 310, such as illustrated in FIG. 3. Bit line 300 is connected to the source of a triple well NMOS transistor 302. The transistor 302 is formed by creating a n-type well in the substrate, then creating a p-type well within the n-type well and forming an NMOS transistor therein. The size of the triple well NMOS transistor 302 in this example is about 40 microns wide by about 1.2 microns long. The p-well in the structure is biased by a bias-potential PWI on line 303. The gate of the transistor 302 is controlled by the control signal BLISOB on line 301. A bit line segment 304 is connected to the source of the transistor 302. Bit line segment 304 is coupled to the drain of a y-select transistor 305. The y-select transistor 305 in the embodiment illustrated is a basic NMOS device having a width of about 30 microns and a length of about 1.2 microns. Source of the transistor 305 is coupled to the data input/output bus at terminal 306. The gate of transistor 305 is controlled by a y-decode signal Y on line 307.

The bit line control element shown in FIG. 4 includes a bit latch storage element 310, which is a basic SRAM type storage element with an enable circuit. Thus, the storage element 310 includes a first inverter composed of p-channel transistor 311 in series with n-channel transistor 312. The p-channel transistor 311 has a width of about 3 microns and a length of about 1.6 microns in this example. The n-channel transistor 312 has a width of about 3 microns and a length of about 1.2 microns in this example. The enable circuit is coupled to the first inverter by means of n-channel transistor 313, which has its source coupled to the ground terminal. The gates of transistors 311 and 312 are connected to node 314 of the memory element. The drain of transistor 311 and the drain of transistor 312 are coupled to node 325. Also the gate of transistor 313 is connected to the control signal BLATEN on line 315.

The second inverter in the memory element 310 is composed of p-channel transistor 318 and n-channel transistor 319. The p-channel transistor 318 has a width of about 6 microns and length of about 1.2 microns, and the n-channel transistor 319 has a width of about 3 microns and a length of about 1.2 microns in this example. The drain of transistor 318 and the drain of transistor 319 are coupled to node 326. The gates of transistors 318 and 319 are coupled to node 325.

The enable circuit in the memory element 310 also includes a p-channel transistor 320 which in this example has a width of about 3 microns and a length of about 0.8 microns. The source of the p-channel transistor 320 is coupled to the node 321 which supplies the LATCHPWR signal, which corresponds to the Latch Power signal in FIG. 3, which is normally VDD. The latch power level is controlled during operations involving the bit line control element as described below.

The storage element 310 has an output at node 326, which is fed back to node 314 as input to the inverter composed of transistors 311 and 312, and an output at node 325 which is connected to the input of the inverter formed of transistors 318 and 319. The outputs 325, 326 can be considered true and complement versions of the data bit stored in the memory element. In the example illustrated node 326 labeled LADATA is considered the true output. The complement output is generated at node 325.

A first input to the memory element 310 is supplied at node 325 across line 350. Line 350 is connected through a pass gate composed of a native n-channel transistor 351 and native p-channel transistor 352 to a supply of the constant voltage, such as VDD 353. The native p-channel transistor is formed using normal PMOS process without a channel enhancement doping so that the threshold of the device is about minus 1.25 volts. In this example, the width of the device is about 5 microns and the length is about 1 micron. The native n-channel device 351 is formed without channel enhancement doping, and thus has a threshold of about 0.45 volts, which is lower than normal n-channel transistors that have enhancement doping in the channel.

The gate of transistor 352 is connected to bit line segment 304. The gate of transistor 351 is connected to the control signal VFY on line 354.

A second input of the memory element 310 is supplied from bit line segment 304 through the pass transistor 356 which is implemented with an n-channel native device having a width of about 12 microns and a length of about 1.2 microns. The gate of the transistor 356 is connected to the control signal LATCHB on line 357.

A first output of the memory element 310 is supplied from node 326 to the gate of a native n-channel transistor 360. The source of the n-channel transistor 360 is connected to the data line power signal DLPWR generated by a multi-level voltage source at node 361. The drain of transistor 360 is coupled to the source of native n-channel pass transistor 362. The drain of transistor 362 is coupled to the bit line segment 304. The gate of transistor 362 is controlled by the data line control signal DLCTL on line 363. Transistor 360 and transistor 362 are implemented with native NMOS devices having widths of about 4 microns and lengths of about 1.2 microns.

A second output of the memory element 310 is supplied at node 326 as well (through node 314) at the gate of n-channel device 370. The source of n-channel device 370 is coupled to ground while the drain of n-channel device 370 is connected to the ABLRES1 line 371. Transistor 370 is implemented with an NMOS device having a width of about 3 microns and a length of about 0.8 microns. The ABLRES1 signal on line 371 is connected in common with other bit latches in the page buffer to a weak pull-up circuit 372, such that if any one of the signals ABLRES1 on line 371 is pulling down (input high), then ABLRES1 is low, providing a NOR gate function to determine whether all of the bit latches in the page buffer have been reset.

The bit latch structure of FIG. 4 may be modified to use an n-channel transistor in place of the p-channel transistor 352. In the n-channel scheme, transistors 352, 351, and 370 are connected to node 326, and the source of transistor 352 is grounded. The gate of the transistor 352 (n-channel in this embodiment) is connected to the bit line segment 304. The n-channel approach is particularly well suited for the erase verify sequence. For example, an erase verify sequence would include the following steps:

1) Preset all of the bit latches so that node 326 stores a high level.
2) Precharge all of the bit lines to a high level.
3) Apply a voltage level to the wordline for erase verify.
4) For those erased high threshold cells, the bit line will remain high, when the verify potential is strobed. This causes node 326 to be reset to zero. If a low threshold cell exists, then the bit line is discharged to ground through the cell, and the bit latch node 326 associated with the low threshold cell remains at the preset high value. Node 371 is then pulled down to trigger another retry pulse.

Figure 5:
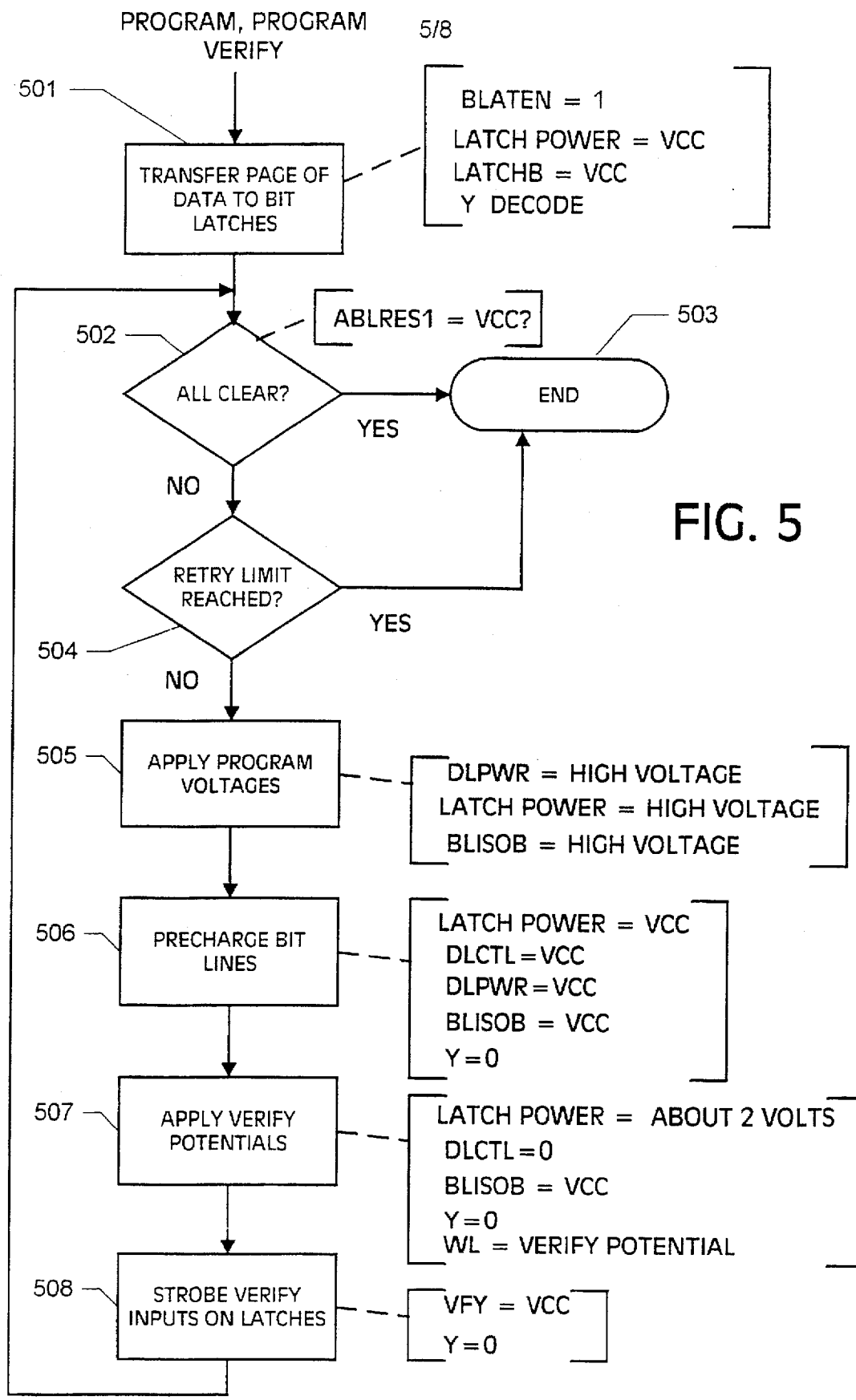
FIG. 5 is a flow chart illustrating the program and program verify operation executed using the bit latches of the present invention for a single threshold level.
Figure 6:
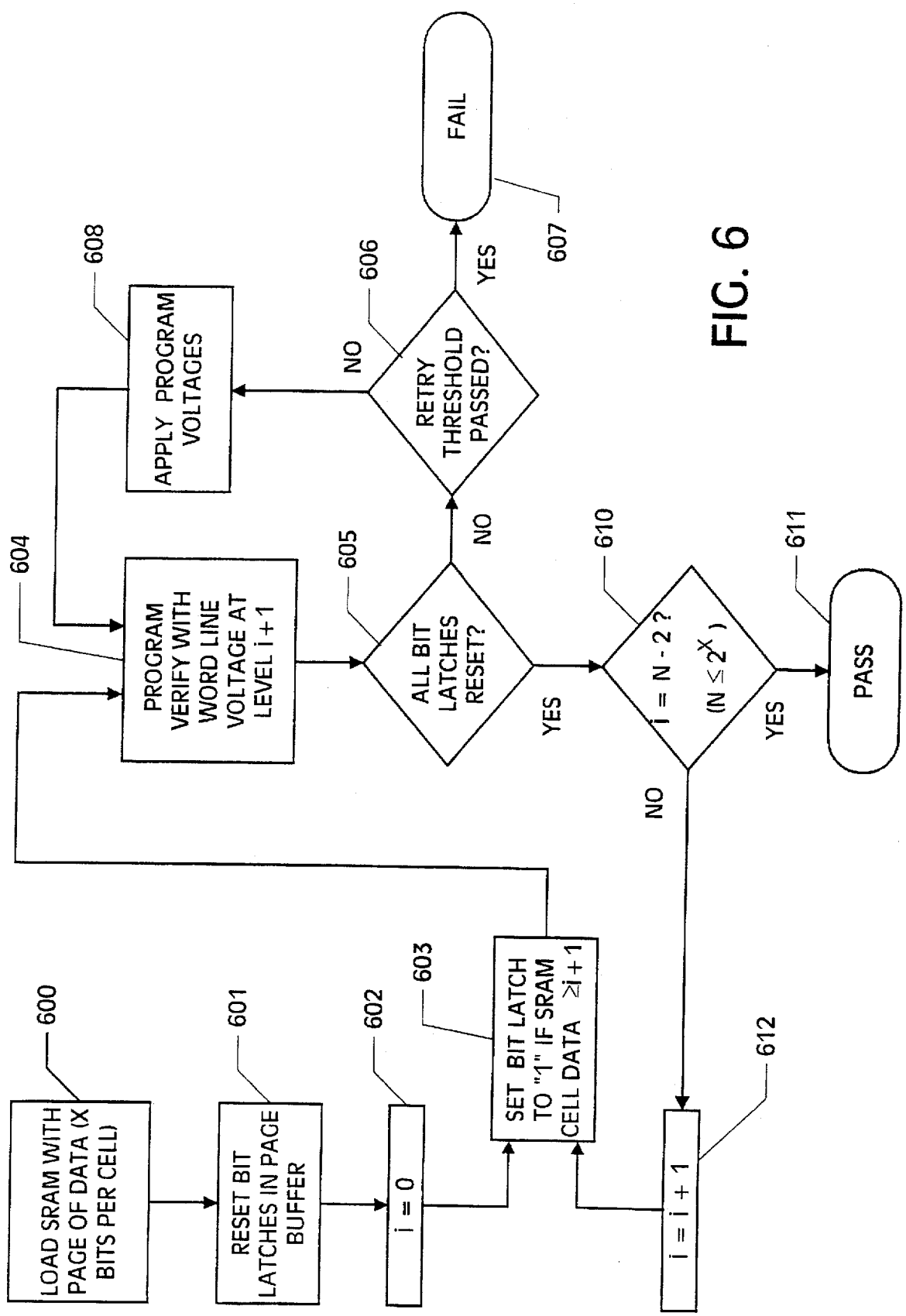
FIG. 6 is a flow chart of a multi-level program and program verify process according to the present invention.
Figure 7:
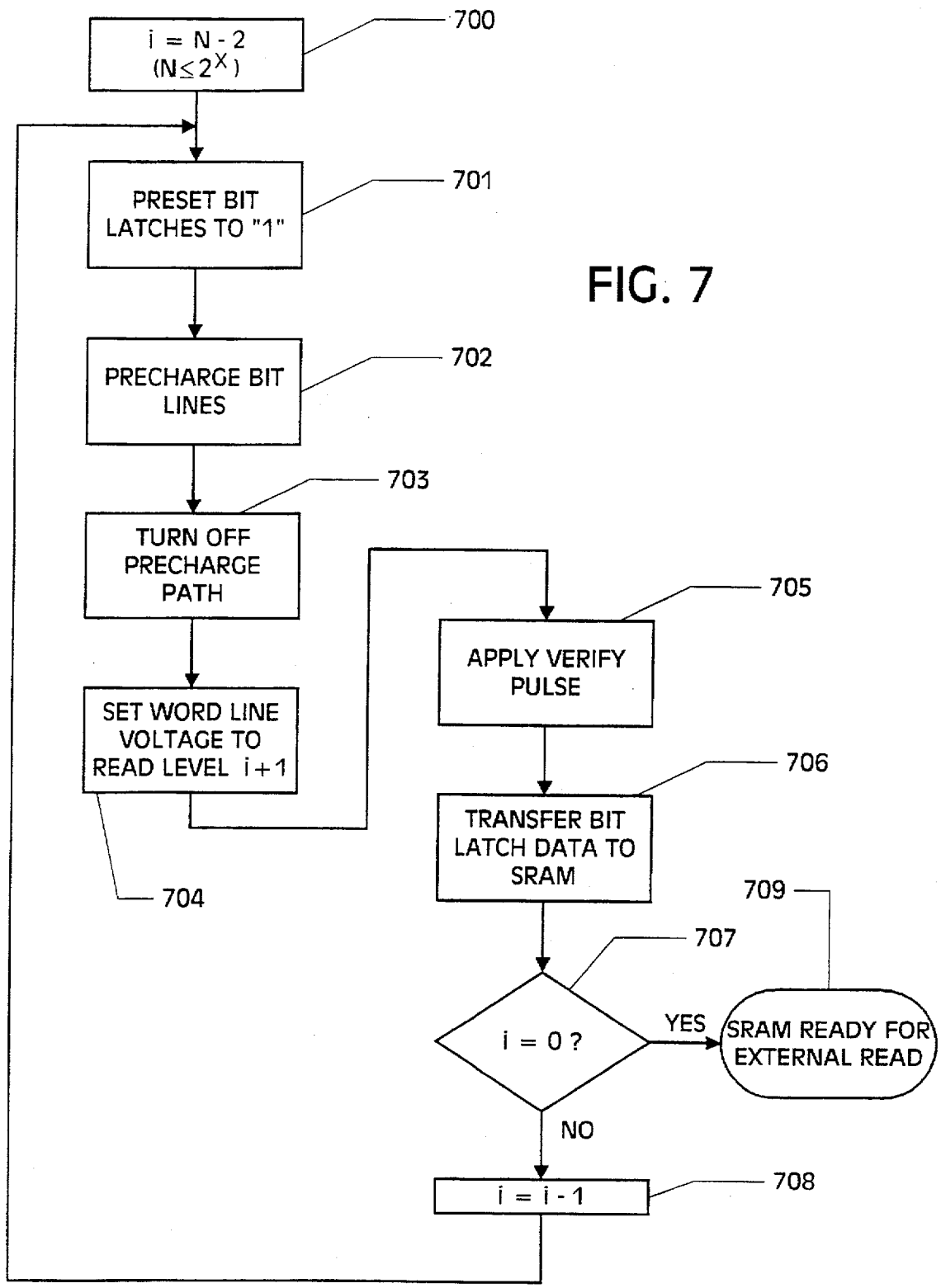
FIG. 7 is a flow chart illustrating the multi-level page read process according to the present invention.
Figure 8:
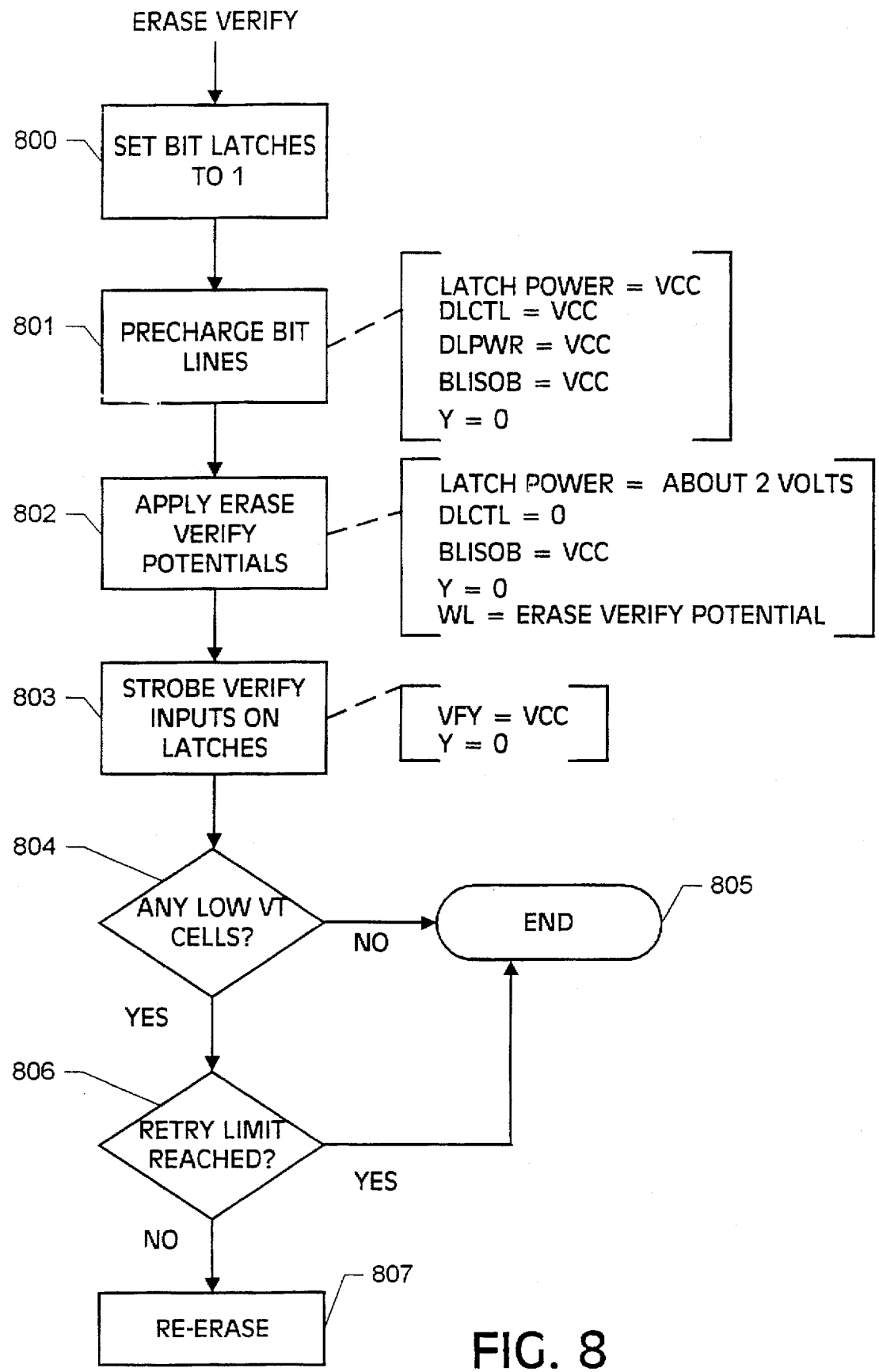
FIG. 8 is a flow chart illustrating a page mode erase verify process according to the present invention.

The unique low current bit latch structure, such as described in FIGS. 3 and 4, provides the ability to execute efficient page mode program and program verify operations as illustrated in FIGS. 5 and 6, efficient page read operations as illustrated in FIG. 7, and efficient erase verify operations as illustrated in FIG. 8.

The program and program verify process is described first in a two level program operation (an erased level and a single programmed level), referring to FIG. 5. A program and program verify process begins by loading an SRAM cache with a page of data (block 500). The page of data in the preferred embodiment is at least 500 bits, and preferably 1K (1024) or more of data.

The data from the SRAM cache is transferred into the bit latches in the page buffer (block 501). During this process, the bit latches are enabled by the BLATEN signal, the latch power is set to the full supply potential VDD, the LATCHB input is set high, and the Y signal is pulsed per column decode operations, as data is transferred byte-by-byte into the bit latches.

The next step in the process determines whether all of the memory elements in the page buffer have been reset (block 502). This is determined by testing the ABLRES1 signal on line 371. If it is high, then all the bit latches are reset. Else, at least one of the bit latches has not been reset. Thus, if all are reset, then the process is completed with a successful program and verify as indicated in block 503. If it is determined at block 502 that at least one of the bit latches remains set, then the algorithm determines whether the program retry limit has been reached (block 503). If the retry limit has been reached, then the process has ended, and an error is indicated. If the retry limit has not been reached, then the algorithm continues to block 505 to apply or reapply the programming potential, only to bit lines for which the memory element in the bit latch has not been reset.

In block 505, the program voltages are applied to program the data from the bit latches into the array. In this step, DLPWR on line 361 is set to the program high voltage, the latch power is set to a high voltage, and the control signal BLISOB on line 301 is set to high voltage. This allows the transfer of a high voltage to the bit line 300 if the output of the memory element 310 at node 326 is high by pulsing the DLCTL signal. If the output of the memory element 310 is low, then the high programming voltage is not connected to the bit line.

After the program cycle, the bit lines are pre-charged (block 506). Bit lines are pre-charged using the bit latch structure of the present invention, setting latch power to VDD, the DLCTL control signal on line 363 to VDD, the data line power on line 361 to VDD, the BLISOB signal line 301 to VDD, and by turning off the Y select transistor 305. Thus, the bit line 300 is pre-charged to the VDD level, or about VDD–$V_T$, where $V_T$ is the NMOS threshold voltage.

After the bit lines are pre-charged, the bit lines are isolated and verify potentials are applied to the array (block 507). The wordlines are set to a verify potential. During this step the latch power is decreased to about 2 volts to reduce the amount of power consumed during the verify operation. The DLCTL signal line 363 is set low to isolate the data line power from the bit line, the BLISOB signal line 301 is set to VDD, and the Y select transistor is turned off. After applying the verify potentials, the verify inputs are strobed (block 508). This occurs by strobing the VFY control signal on line 354. In this operation, the Y select transistor remains turned off. If when the VFY signal is strobed, the voltage on the bit line at node 304 is low enough to turn on transistor 352, then the VDD potential is applied to node 325 of the memory element 310. This results in resetting the memory element so that the output on line 326 is low. If the accessed cell on the bit line has a low threshold, then the pre-charged bit line is discharged through the cell, and the voltage level on the bit line turns on the transistor 352. In this way, the memory element 310 does not fight for current on the bit line, and relatively high speed verify operation is achieved.

After strobing the verify inputs on the bit latches in block 508, the process loops to block 502 to retry programming of cells which fail verify, for a threshold number of retries.

FIG. 6 is a flow chart illustrating extension of the two level program operation shown in FIG. 5 to more than two program levels, such that there is an erased level, and at least two programmed levels. In the embodiment of FIG. 6 there is an erase level and three programmed levels for a two bit per cell implementation. The present invention can be extended to any number of levels, which are supported by the memory cell technology being utilized.

Thus, the multi-level program and program verify operation shown in FIG. 6 begins with loading the SRAM with a page of data, where a page includes X bits per cell (block 600). The bit latches in the page buffer are reset at the beginning of the operation (block 601). An index is set to zero (block 602). Next, an operation is executed to set the bit latch for a given cell to "1" (a "program" level) if the SRAM cell data is greater than or equal to the index i+1. Thus, if there are two bits per cell, then the data stored in the cell can correspond to the levels 0, 1, 2 and 3, for a four level cell. In the embodiment being described, the high threshold level is the erased state. Each successive level is programmed to a lower threshold than the previous. Thus, in block 603, the cell decode logic 50 of FIG. 1 supplies a "1" to the data input/output bus 14 if the data to be stored in the cell corresponds to 1, 2 or 3 (0 corresponding to the erased state). In the next step, a program verify operation is executed with the wordline voltage set at level index i+1 (block 604). Block 604 of FIG. 6 corresponds to the steps 506, 507, 508 of FIG. 5. The voltage level i+1 corresponds to a wordline voltage for the threshold level to be programmed into cells storing the value 1.

For the four level cell in this example, the programmed threshold voltages VT are defined as follows:

| State | VT Range (volts) |
| --- | --- |
| 0 | $4.5 \leq VT$ |
| 1 | $3.2 \leq VT \leq 4.0$ |
| 2 | $2.0 \leq VT \leq 2.8$ |
| 3 | $VT \leq 1.5$ |

Thus, in block 604 with i=0, the program verify voltage is set to the level corresponding to a threshold voltage between 3.2 volts and 4.0 volts. Thus in one example, the wordline voltage at block 604 for index i=0 is set to within the range of 3.4 volts to 3.8 volts to allow a verify margin.

After executing the program and program verify cycle with the wordline voltage set for level i in at block 604, then the algorithm determines whether all of the bit latches have been reset (block 605), corresponding to block 502 of FIG. 5. If they have not all been reset, then the algorithm determines whether a retry limit has been passed (block 606). If the retry limit has been passed, then the algorithm fails (block 607). If the retry limit has not been passed, then the program voltages are applied (block 608). For the architecture shown in FIG. 2, the program voltages involve applying a negative voltage to the wordline, such as about minus 5 to minus 8 volts, a positive voltage to the drain, such as approximately plus 9 to plus 6 volts across the bit lines, and for example zero volts or floating potential on the source terminal.

After applying the program voltages in response to the bit latches as discussed above, at block 607, the program verify operation of block 604 is re-executed. Then, it is determined whether all of the bit latches are reset at block 605. The loop of blocks 604–608 is repeated until the retry threshold is reached, or another error condition is encountered, or until all of the bit latches are reset. If at block 605, all of the bit latches have been reset, then the algorithm tests the index i to determine whether it is equal to N–2 (where N is less than or equal to $2^x$) (block 610). For a four level cell, N is equal to 4. This test with N=4, at block 610 results in looping through the algorithm for the index i=0, 1 and 2. Thus, if the index i=2, at block 610, then the program operation is ended and the verify operations are passed for the multi-level operation (block 611). If at block 610, the index i is not yet equal to 2, then the index is incremented by 1 at block 612. After block 612, block 603 is executed to set the bit latch data to the value "1" if the SRAM cell data is greater than or equal to i+1. Thus in the second loop through block 603, the bit latch is set to 1 if the cell data is equal to 2 or 3, otherwise the bit latch is set to 0 (the "do not program" state).

After block 603, the process based on blocks 604–608 is executed until all of the bit latches are reset. In the program verify cycles are re-executed for each level with the index =0 to 2 for a four level cell. This results in the state of the bit latches such as illustrated in the following table:

|  | state 0 | state 1 | state 2 | state 3 | index |  |
|---|---|---|---|---|---|---|
| latch-pgm | 0 | 1 | 1 | 1 | =0 |  |
| latch-pv | 0 | 0 | 0 | 0 | =0 | WL = 3.6 v |
| latch-pgm | 0 | 0 | 1 | 1 | =1 |  |
| latch-pv | 0 | 0 | 0 | 0 | =1 | WL = 2.4 v |
| latch-pgm | 0 | 0 | 0 | 1 | =2 |  |
| latch-pv | 0 | 0 | 0 | 0 | =2 | WL = 1.6 v |

Thus, as shown in the table in the first row for index =0, cells in state 0 have the corresponding bit latches set to the do not program value of "0". Cells to be programmed to states 1, 2 or 3 have their bit latch set to the "program" value of 1. After the program verify cycle, with =0, during which the wordline voltage is set to about 3.6 volts in the illustrated example, the bit latches of those cells in states 0 and 1 are reset to 0, those cells in states 2 and 3 may also be reset during the program verify operation. The index is then incremented, and cells in states 2 and 3 have corresponding bit latches set to the program value of 1. Then, the program verify operation is executed with the wordline voltage equal to about 2.4 volts in this example. This results in cells programmed to states 0, 1 and 2 having their bit latches set to the do not program value of 0, and those cells to be programmed to state 3 may be reset to 0. Finally, for cells to be programmed to state 3, the index =2, and only those cells storing state 3 data have their bit latches set to 1. In this case, the program operation is applied, and the program verify is executed with the wordline voltage equal to about 1.6 volts in this example. With wordline voltage at 1.6 volts, the bit latches will be reset for all states as indicated in the table.

Thus, most of the time required for the programming operation is consumed getting cells to state 3. According to the algorithm of FIG. 6, the time is shorter because of the ability to shift the threshold in parallel of cells to be programmed to state 2 during the programming of state 1 cells, and of cells to be programmed to the state 3 during the programming of state 1 cells and state 2 cells.

FIG. 7 illustrates the multi-level read operation according to the present invention. The algorithm begins by setting the index i to N–2 (block 700).

The algorithm continues by setting all of the bit latches to a constant value, such that the output on line 326 is high (block 701). One technique for setting all of the bit latches high in parallel can be achieved by turning on all of the Y select transistors 307 for all bit lines. The latch power level on line 321 is decreased to about 1.5 volts. The data is supplied on node 306 at VDD, and the LATCHB signal line 357 is set to VDD. This way, the data value is transferred to the input 314 of the latch. At that point, the latch power is slowly powered up to latch the data into the cell with the relatively low current parallel operation. Alternatively, the bit latches can be set byte-by-byte, relying on the column decoding operation in a manner similar to transferring data from the SRAM into the bit latches.

After all bit latches have been pre-set, the algorithm proceeds to a verify procedure which is based on first a pre-charge of the bit line (block 702). This pre-charge is accomplished using the same control signals as is described for block 506 of FIG. 5. After pre-charging the bit lines, the discharge paths from the bit lines other than through the memory cells, are turned off (block 703). This is done by setting DLCTL low.

Next, the wordline voltage is set to the read level corresponding to the program level i+1 (block 704). In this example, for level 3, the wordline voltage is set to about 1.8 volts; for level 2, the wordline voltage is set to about 3 volts for the read operation; and for level 1, the wordline voltage is set to about 4.2 volts for the read operation. Then, the verify inputs on the bit latches are strobed (block 705). This is similar to the operation of block 508 of FIG. 5. After strobing the verify inputs, the control bits stored in the bit latches are read to the cell accumulate and decode logic 50 in preparation for transfer to the SRAM (block 706). This process is executed by setting the DLPWR value to ground, setting the DLCTL value to VDD, setting the BLISOB signal to ground and the LATCHB signal to ground. The Y transistors are pulsed in response to the column decoding operation. Thus, if a bit latch has been reset, then the output LADATA on line 326 will be low, preventing the connection of ground to the bit line segment 304. However, if it has not been reset, then the high value stored in the memory element will couple ground to the bit line segment 304, with relatively high current drive, which will be transferred to the data I/O bus via sense amplifiers. Because of the relatively high drive of the bit latch structure, compared to that of low threshold memory cells, this procedure is faster than reading the cells.

After block 706, the algorithm tests whether the index =0 at block 707. If it is equal to 0, then the SRAM is ready for an external read (block 709). If it is not equal to 0, then is decremented by 1 at block 708, and the algorithm loops to block 701 to test the following program levels.

In the cell accumulate and decode block 50, the data for each cycle of the read process is accumulated, and the result is then transferred to the SRAM.

Thus, for the process shown in FIG. 7, where level 3 (lowest threshold) is read first, followed by levels 2 and 1, a "3" (11) is written to the SRAM if the threshold voltage is below the read voltage only in the first cycle, when equals 2. The data "2" (10) is written if the algorithm passes during both the first and second cycles where equals 2 and 1, and the value "1" ((01) is written if the threshold is below the read voltage in all three of the cycles 2, 1 and 0. If the threshold is not below the read voltage in any of the cycles, then the value "0" (00) is written into the memory cell.

In an alternative approach, levels may be sensed in a reverse order, and the cell decode and accumulate logic modified as appropriate.

After reading the bit latches to the SRAM, the SRAM is ready to be read through the data input/output bus of the integrated circuit. Thus, a page mode read is provided, in which the first byte is available after the process of FIG. 7 is executed, which takes on the order of microseconds, depending on the bit line settling times, the number of levels per cell, and the like. However, all subsequent bytes in the page can be read at the SRAM speed, which is much faster than normal reads to floating gate memory arrays.

FIG. 8 provides an example erase verify operation using the low current bit latch of the present invention. The process begins after an erase operation, which in the embodiment described is based on charging the floating gates of a block of memory cells in the array, to establish a high threshold voltage state for all of the erased cells. Thus, for example, to erase a block of cells, about negative 8 volts is applied to the drain; positive 12 volts is applied to the control gate; and negative 8 volts is applied to the sources of the cells in the block. After the erase, the bit latches are set to the constant value of 1 (block 800), using a technique such as that described with reference to block 701 of FIG. 7. Next, the bit lines are pre-charged (block 801). This is similar to the process described with reference to block 506 of FIG. 5. After pre-charging the bit lines, erase verify potentials are applied to the wordlines (block 802). This is similar to the process described with reference to block 507 of FIG. 5, except that erase verify potentials are applied to the wordlines. These potentials are typically near, or higher than, VDD, such as for example 5 volts, to establish an erase verify margin. After applying erase verify potentials, the verify inputs on the bit latches are strobed (block 803), such as described with reference to block 508 of FIG. 5. After strobing the bit latches, the algorithm proceeds to determine whether any low threshold cells (not erased) were detected (block 804). A low threshold cell would result in resetting of the bit latch. Thus, it is necessary to determine whether any one bit latch has been reset, the opposite operation to determining whether all bit latches have been reset as described with reference to block 502 of FIG. 5. This can be accomplished by a read process in which the bit latches are read byte-by-byte in through the column decoder. Alternatively, logic can be used to sense the output of the bit latches in parallel for example, using a page-wide NOR function to determine whether one latch has been reset.

If there were no low threshold cells detected, then the process is finished as indicated in block 805. If a low threshold cell was detected, then the algorithm determines whether a retry limit had been reached (block 806). If the retry limit is reached, then the process is finished at block 805, and an error is indicated. If the retry limit had not been reached, then a re-erase operation is executed (block 807).

Accordingly, the present invention provides a unique bit line control element structure which supports a multiple bit per cell, parallel, page mode program and program verify, page mode read, and page mode erase verify. Three critical issues solved by the unique bit latch structure, include excess current and power crash problems associated with a highly parallel operation on a latch structure, bit line coupling noise which might occur between bit lines during the parallel operation, and the bit line discharge time associated with the verify operations. The excess current and power crash problem is solved by providing the capability to control the power level on the memory element in the bit latches. Thus, at appropriate times the bit latch power is reduced to reduce the current consumption of the device. The bit line coupling problem can be solved by even and odd bit line logic, so that two sets of control signals are used for strobing the VFY signal and the DLCTL signal in the structure of FIG. 4. By alternate strobing, neighboring bit lines are not sensed at the same time, so fringing capacitance between them will not cause unwanted disturbance.

The bit line discharge time depends on the bit line capacitance and the cell discharge current. However, because the bit line is isolated from the bit latch during the verify process, discharge time is not complicated by fighting for current consumption against the bit latch structure. Thus a calculated fixed time can be used by the state machine executing the verify process. Alternatively, a small current source, such as a referenced floating gate cell can be used to discharge a reference bit line capacitor and to generate a timeout signal by detecting the level on the reference bit line capacitor. This reference bit line capacitor approach provides more chip specific verify timing than possible using a calculated fixed time.

Also, the same bit latch is used for a page mode read operation. Conventional flash memory read operations are random access and relatively slow. However, a high speed page mode read access can be executed as discussed above using the unique bit latch of the present invention.

Finally, a page mode erase verify process is provided which can be used to speed up the erase operation in a flash memory device.

Thus, a multiple bit per cell, page mode flash memory device is provided which provides for more precise control over the threshold voltage than is available with prior art multi-level designs. Furthermore, high speed page reads are possible, albeit with a slower set-up period that can be hidden as background jobs in firmware design. Thus, a page mode system with a unique low current bit latch is provided has been expanded to a multi-level cell using precise operation of wordline voltages during read, program, program verify and erase verify operations.

The present invention has been described primarily with reference to a memory cell in which the flash erased state is defined as a high threshold for the floating gate memory cells, and a programmed states are defined as a set of lower threshold levels. However, the present invention can be applied if the flash cell is defined as erased when it has a low threshold, and programmed when it has a high threshold.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit, comprising:

an array of floating gate memory cells, including a plurality of wordlines connected to respective sets of memory cells in the array, and including a plurality of bit lines connected to respective sets of memory cells in the array;

a wordline voltage source supplying selectively a plurality of wordline voltage, the wordline voltages in the plurality corresponding to respective threshold voltage levels of the memory cells in the array;

decoder logic which connects the wordline voltage source to a selected wordline in the plurality of wordlines;

a plurality of bit latches, bit latches in the plurality of bit latches coupled to corresponding bit lines in the plurality of bit lines and having a first state and second state, and including circuits to change bit latches in the plurality of bit latches from the first state to the second state in response to signals on the corresponding bit lines generated in response to a wordline voltage on a selected wordline being one of greater than or equal to, or less than or equal to, the threshold voltage level of a memory cell connected to the selected wordline and to the corresponding bit line; and logic to control the wordline voltage source and the plurality of bit latches to apply in a sequence the plurality of wordline voltages to the selected wordline, and to sense the state of the plurality of bit latches after applying each wordline voltage in the sequence to determine the threshold voltage levels of the set of memory cells connected to the selected wordline.

2. The integrated circuit of claim 1, including a buffer memory coupled to the plurality of bit lines, and wherein said logic to sense the state of the plurality of bit latches includes circuitry for transferring data indicating the states of bit latches in the plurality of bit latches to the buffer memory.

3. The integrated circuit of claim 2, wherein the buffer memory includes at least 2 memory bit locations per bit latch.

4. The integrated circuit of claim 2, wherein the circuitry for transferring data includes logic which accumulates the state of each bit latch over the sequence, and stores a resulting value in the buffer memory.

5. The integrated circuit of claim 2, wherein the buffer memory comprises a static random access memory (SRAM) array.

6. The integrated circuit of claim 1, including logic to program memory cells in the array by setting threshold voltage levels of the memory cells selectively to one of more than two levels.

7. The integrated circuit of claim 1, wherein the array of floating gate memory cells comprises a NOR array.

8. The integrated circuit of claim 1, including:

program logic to control the wordline voltage source and the plurality of bit latches to program a set of memory cells connected to a selected wordline, including control logic which executes a first threshold cycle to set bit latches in the plurality of bit latches to a "program" state for memory cells coupled to the corresponding bit lines to be programmed to a first threshold level and to a "do not program" state for memory cells coupled to the corresponding bit lines to be left in an erased state, to execute a program cycle including applying a program potential to bit lines coupled to bit latches loaded with a program state, applying a first wordline voltage to the selected wordline, wherein the first wordline voltage corresponds to the first threshold level, and setting the state of the plurality of bit latches to the "do not program" state after applying the first wordline voltage to indicate whether the first threshold level has been successfully programmed, and logic to retry the program cycle until all bit latches in the plurality of bit latches are set to the "do not program" state or until an error condition is encountered; and a second threshold cycle to set bit latches in the plurality of bit latches to the "program" state for memory cells coupled to the corresponding bit lines to be programmed to a second threshold level and to a "do not program" state for memory cells coupled to the corresponding bit lines to be left in an erased state or left programmed to the first threshold level, to execute a program cycle including applying a program potential to bit lines coupled to bit latches loaded with the "program" state, applying a second wordline voltage to the selected wordline, wherein the second wordline voltage corresponds to the second threshold level, and setting the state of the plurality of bit latches to the "do not program" state after applying the second wordline voltage to indicate whether the second threshold level has been successfully programmed, and logic to retry the program cycle until all bit latches in the plurality of bit latches are set to the "do not program" state or until an error condition is encountered.

9. The integrated circuit of claim 8, wherein the control logic further executes:

a third threshold cycle to set bit latches in the plurality of bit latches to the "program" state for memory cells coupled to the corresponding bit lines to be programmed to a third threshold level and to a "do not program" state for memory cells coupled to the corresponding bit lines to be left in an erased state, left programmed to the first threshold level, or left programmed to the second threshold level, to execute a program cycle including applying a program potential to bit lines coupled to bit latches loaded with the "program" state, applying a third wordline voltage to the selected wordline, wherein the third wordline voltage corresponds to the third threshold level, and setting the state of the plurality of bit latches to the "do not program" state after applying the third wordline voltage to indicate whether the third threshold level has been successfully programmed, and logic to retry the program cycle until all bit latches in the plurality of bit latches are set to the "do not program" state or until an error condition is encountered.

10. The integrated circuit of claim 8, wherein the error condition includes exceeding a maximum number of retries.

11. The integrated circuit of claim 8, wherein the program cycle includes applying a negative potential to the selected wordline.

12. The integrated circuit of claim 8, wherein memory cells in the erased state have a threshold level higher than the first threshold level and the second threshold level.

13. The integrated circuit of claim 1, wherein the logic to sense the state of the plurality of bit latches after applying each wordline voltage in the sequence, includes circuits to apply a first voltage to the plurality of bit lines, to isolate the bit lines such that bit lines coupled to memory cells having a threshold level lower than the wordline voltage being applied are driven toward a second voltage through the memory cells, and to set the bit latches in the plurality of bit latches to the second state if the voltage on the corresponding bit line is driven to about the second voltage.

14. The integrated circuit of claim 13, wherein the second voltage is lower than the first voltage.

15. A floating gate memory module on a semiconductor substrate, comprising:

a memory array including at least X rows and Y columns of floating gate memory cells, the floating gate memory cells having respective control gates, source terminals and drain terminals, and a column of floating gate cells including a plurality of column segments;

X wordlines, each coupled to the floating gate memory cells in one of the X rows of floating gate memory cells;

a plurality of local bit lines coupled to the drain terminals of the floating gate memory cells in respective column segments;

a plurality of local source lines coupled to the source terminals of the floating gate memory cells in respective column segments and to a source of a source potential;

a plurality of global bit lines;

data in and out circuitry coupled to the plurality of global bit lines which provide for reading and writing data in the memory array;

selector circuitry, coupled to the plurality of local bit lines and to the plurality of global bit lines, which provides for selective connection of local bit lines to corresponding global bit lines in the plurality of global bit lines, so that access to the Y columns of floating gate memory cells by the data in and out circuitry is provided across the plurality of global bit lines; and program logic to program memory cells in the array by setting threshold levels of the memory cells selectively to one of more than two levels.

16. The floating gate memory module of claim 15, including:

a wordline voltage source supplying selectively a plurality of wordline voltages, the wordline voltages in the plurality corresponding to respective threshold levels of the memory cells in the array;

decoder logic which connects the wordline voltage source to a selected wordline in the plurality of wordlines;

a plurality of bit latches, bit latches in the plurality of bit latches coupled to corresponding global bit lines in the plurality of global bit lines and having a first state and second state, and including circuits to change bit latches in the plurality of bit latches from the first state to the second state in response to signals on the corresponding global bit lines generated in response to a wordline voltage on a selected wordline being one of greater than or equal to, or less than or equal to, the threshold level of a memory cell connected to the selected wordline and to the corresponding global bit line; and logic to control the wordline voltage source and the plurality of bit latches to apply in a sequence the plurality of wordline voltages to the selected wordline, and to sense the state of the plurality of bit latches after applying each wordline voltage in the sequence to determine the threshold levels of the set of memory cells connected to the selected wordline.

17. The floating gate memory module of claim 16, wherein the data in and out circuitry includes a buffer memory coupled to the plurality of global bit lines, and wherein said logic to sense the state of the plurality of bit latches includes circuitry for transferring data indicating the states of bit latches in the plurality of bit latches to the buffer memory.

18. The floating gate memory module of claim 17, wherein the buffer memory includes at least 2 memory bit locations per bit latch.

19. The floating gate memory module of claim 17, wherein the circuitry for transferring data includes logic which accumulates the state of each bit latch over the sequence, and stores a resulting value in the buffer memory.

20. The floating gate memory module of claim 17, wherein the buffer memory comprises a static random access memory (SRAM) array.

21. The floating gate memory module of claim 16, wherein the logic to sense the state of the plurality of bit latches after applying each wordline voltage in the sequence, includes circuits to apply a first voltage to the plurality of global bit lines, to isolate the global bit lines such that only bit lines coupled to memory cells having a threshold voltage lower than the wordline voltage being applied are driven toward a second voltage through the memory cells, and to set the bit latches in the plurality of bit latches to the second state if the voltage on the corresponding global bit line is driven to about the second voltage.

22. The floating gate memory module of claim 21, wherein the second voltage is lower than the first voltage.

23. The floating gate memory module of claim 15, wherein the Y columns of floating gate memory cells in the memory array comprise:

N pairs of column segments of floating gate memory cells, wherein pairs of column segments in the plurality comprise;

two local bit lines coupled to the selector circuitry, one local source line coupled to source reference circuitry, a first set of floating gate memory cells in a first column segment of the pair of column segments between one of the two local bit lines and the local source line, a second set of floating gate memory cells in a second column segment of the pair of column segments between the other of the two local bit lines and the local source line, members of a subset of the M wordlines each coupled to a floating gate memory cell in the first set and a floating gate memory cell in the second set; and wherein the selector circuitry includes segment selector circuitry, coupled to the two local bit lines and at least one of the plurality of global bit lines, which provides for selective connection of the first and second sets to the at least one of the plurality of global bit lines.

24. The floating gate memory module of claim 15, including:

a wordline voltage source supplying selectively a plurality of wordline voltages, the wordline voltages in the plurality corresponding to respective threshold levels of the memory cells in the array;

decoder logic which connects the wordline voltage source to a selected wordline in the plurality of wordlines;

a plurality of bit latches, bit latches in the plurality of bit latches coupled to corresponding global bit lines in the plurality of global bit lines and having a first state and second state, and including circuits to change bit latches in the plurality of bit latches from the first state to the second state in response to signals on the corresponding global bit lines generated in response to a wordline voltage on a selected wordline being one of greater than or equal to, or less than or equal to, the threshold level of a memory cell connected to the selected wordline and to the corresponding global bit line wherein the program logic to control the wordline voltage source and the plurality of bit latches to program a set of memory cells connected to a selected wordline, including control logic which executes a first threshold cycle to set bit latches in the plurality of bit latches to a program state for memory cells coupled to the corresponding global bit lines to be programmed to a first threshold level and to a "do not program" state for memory cells coupled to the corresponding global bit lines to be left in an erased state, to execute a program cycle including applying a program potential to global bit lines coupled to bit latches loaded with a program state, applying a first wordline voltage to the selected wordline, wherein the first wordline voltage corresponds to the first threshold level, and setting the state of the plurality of bit latches to the "do not program" state after applying the first wordline voltage to indicate whether the first threshold level has been successfully programmed, and logic to retry the program cycle until all bit latches in the plurality of bit latches are set to the "do not program" state or until an error condition is encountered; and a second threshold cycle to set bit latches in the plurality of bit latches to a program state for memory cells coupled to the corresponding global bit lines to be programmed to a second threshold level and to a "do not program" state for memory cells coupled to the corresponding global bit lines to be left in an erased state or left programmed to the first threshold level, to execute a program cycle including applying a program potential to global bit lines coupled to bit latches loaded with a program state, applying a second wordline voltage to the selected wordline, wherein the second wordline voltage corresponds to the second threshold level, and setting the state of the plurality of bit latches to the "do not program" state after applying the second wordline voltage to indicate whether the second threshold level has been successfully programmed, and logic to retry the program cycle until all bit latches in the plurality of bit latches are set to the "do not program" state or until an error condition is encountered.

25. The floating gate memory module of claim 24, wherein the control logic further executes:

a third threshold cycle to set bit latches in the plurality of bit latches to a program state for memory cells coupled to the corresponding bit lines to be programmed to a third threshold level and to a "do not program" state for memory cells coupled to the corresponding bit lines to be left in an erased state, left programmed to the first threshold level, or left programmed to the second threshold level, to execute a program cycle including applying a program potential to bit lines coupled to bit latches loaded with a program state, applying a third wordline voltage to the selected wordline, wherein the third wordline voltage corresponds to the third threshold level, and setting the state of the plurality of bit latches to the "do not program" state after applying the third wordline voltage to indicate whether the third threshold level has been successfully programmed, and logic to retry the program cycle until all bit latches in the plurality of bit latches are set to the "do not program" state or until an error condition is encountered.

26. The floating gate memory module of claim 24, wherein the error condition includes exceeding a maximum number of retries.

27. The floating gate memory module of claim 24, wherein the program cycle includes applying a negative potential to the selected wordline.

28. The floating gate memory module of claim 24, wherein memory cells in the erased state have a threshold level higher than the first threshold level and the second threshold level.

29. For an array of floating gate memory cells including bit lines coupled with corresponding columns of cells in the array, wordlines coupled with corresponding rows of cells in the array, and bit latches coupled to the respective bit lines, a method for determining a state of a set of memory cells in the array, comprising the steps of:

setting a set of bit lines across which memory cells in the set of memory cells are accessible to an initial voltage level;

applying a first wordline voltage to a selected wordline across which memory cells in the set of memory cells are accessible;

first responding during said step of applying a first wordline voltage, to changes in respective voltage levels of bit lines in the set of bit lines in parallel to store a constant in bit latches in the set of bit latches coupled to bit lines on which the respective voltage levels pass a determinate threshold;

storing the state of the bit latches in the set of bit latches after said step of first responding;

setting the set of bit lines to an initial voltage level after said step of first responding;

applying a second wordline voltage to the selected wordline, wherein the second wordline voltage is different than the first wordline voltage;

second responding during said step of applying a second wordline voltage, to changes in respective voltage levels of bit lines in the set of bit lines in parallel to store a constant in bit latches in the set of bit latches coupled to bit lines on which the respective voltage levels pass the determinate threshold; and storing the state of the bit latches in the set of bit latches after said step of second responding.

30. The method of claim 29, wherein the initial voltage levels in the two steps of setting are higher than the determinate threshold.

31. The method of claim 29, wherein the initial voltage levels in the two steps of setting are lower than the determinate threshold.

32. The method of claim 29, wherein the steps of responding to changes includes providing pass transistors having gate terminals, between a supply of the constant and inputs of respective bit latches in the set of bit latches, and connecting the bit lines in the set of bit lines to gate terminals of the pass transistors.

33. The method of claim 29, wherein the step of responding to changes includes providing p-channel pass transistors, having gate terminals, between a voltage source and inputs of respective bit latches in the set of bit latches, and connecting the bit lines in the set of bit lines to gate terminals of the p-channel pass transistors, and the initial voltage levels in the two steps of setting are high enough to turn off the p-channel pass transistors, and the determinate threshold is adequate to turn on the p-channel pass transistors.

34. The method of claim 29, wherein the steps of responding to changes includes providing n-channel pass transistors, having gate terminals, between a voltage source and inputs of respective bit latches in the set of bit latches, and connecting the bit lines in the set of bit lines to gate terminals of the n-channel pass transistors, and the initial voltage levels in the two steps of setting are high enough to turn on the n-channel pass transistors, and the determinate threshold is low enough to turn off the n-channel pass transistors.

35. The method of claim 29, wherein the steps of responding includes storing the constant in bit latches substantially without drawing current from the respective bit lines.

36. The method of claim 29, including prior to said first step of setting a set of bit lines to an initial voltage level, the step of:

presetting the set of bit latches to a complement of said constant.

37. The method of claim 29, wherein said set of bit latches includes more than 500 members.

38. The method of claim 29, wherein said set of bit latches includes more than 1000 members.

39. For an array of floating gate memory cells including bit lines coupled with corresponding columns of cells in the array, wordlines coupled with corresponding rows of cells in the array, and bit latches coupled to the corresponding bit lines, a method for programming a set of multiple bit per cell memory cells in the array, comprising the steps of:

setting bit latches in a set of bit latches coupled through corresponding bit lines to memory cells to be programmed to a first threshold level to a "program" state, and other bit latches in the set of bit latches to a "do not program" state;

executing a first level program and program verify cycle including the steps of
1) applying a programming potential to bit lines in the set of bit lines in response to a "program" state in corresponding bit latches in the set of bit latches;
2) setting the set of bit lines across which memory cells in the set of memory cells are accessible to an initial voltage level;
3) applying a first wordline voltage to a wordline across which memory cells in the set of memory cells are accessible, the first wordline voltage corresponding to the first threshold level;
4) responding to changes in respective voltage levels on bit lines in the set of bit lines in parallel to set bit latches in the set of bit latches on which the respective voltage levels on corresponding bit lines pass a determinate threshold during the step of applying the first wordline voltage, to the "do not program" state;

retrying the first level program and program verify cycle if any bit latches remain in the "program" state until a retry limit is reached, or until all bit latches in the set of bit latches have been set to the "do not program" state;

setting bit latches in the set of bit latches coupled through corresponding bit lines to memory cells to be programmed to a second threshold level to the "program" state, and other bit latches in the set of bit latches to the "do not program" state;

executing a second level program and program verify cycle including the four steps of
1) applying a programming potential to bit lines in the set of bit lines in response to a "program" state in corresponding bit latches in the set of bit latches;
2) setting the set of bit lines across which memory cells in the set of memory cells are accessible to an initial voltage level;
3) applying a second wordline voltage to a wordline across which memory cells in the set of memory cells are accessible, the second wordline voltage corresponding to the second threshold level;
4) responding to changes in respective voltage levels of bit lines in the set of bit lines in parallel to set bit latches in the set of bit latches on which the respective voltage levels on corresponding bit lines pass a determinate threshold during the step of applying the second wordline voltage, to the "do not program" state; and retrying the second level program and program verify cycle if any bit latches remain in the "program" state until a retry limit is reached, or until all bit latches in the set of bit latches have been set to the "do not program" state.

40. The method of claim 39, including after the step of retrying the second level program and program verify cycle:

setting bit latches in the set of bit latches coupled through corresponding bit lines to memory cells to be programmed to a third threshold level to the "program" state, and other bit latches in the set of bit latches to the "do not program" state;

executing a third level program and program verify cycle including the four steps of
1) applying a programming potential to bit lines in the set of bit lines in response to a "program" state in corresponding bit latches in the set of bit latches;
2) setting the set of bit lines across which memory cells in the set of memory cells are accessible to an initial voltage level;
3) applying a third wordline voltage to a wordline across which memory cells in the set of memory cells are accessible, the third wordline voltage corresponding to the third threshold level;
4) responding to changes in respective voltage levels on bit lines in the set of bit lines in parallel to set bit latches in the set of bit latches on which the respective voltage levels on corresponding bit lines pass a determinate threshold during the step of applying the third wordline voltage to the "do not program" state; and retrying the third level program and program verify cycle if any bit latches remain in the "program" state until a retry limit is reached, or until all bit latches in the set of bit latches have been set to the "do not program" state.

* * * * *